(12) United States Patent
Tang et al.

(10) Patent No.: US 12,022,737 B2
(45) Date of Patent: Jun. 25, 2024

(54) SYSTEM INCLUDING PIEZOELECTRIC CAPACITOR ASSEMBLY HAVING FORCE-MEASURING, TOUCH-SENSING, AND HAPTIC FUNCTIONALITIES

(71) Applicant: UltraSense Systems, Inc., San Jose, CA (US)

(72) Inventors: Hao-Yen Tang, San Jose, CA (US); Sina Akhbari, San Jose, CA (US); Mo Maghsoudnia, San Jose, CA (US)

(73) Assignee: UltraSense Systems, Inc., San Jose, CA (US)

( * ) Notice: Subject to any disclaimer, the term of this patent is extended or adjusted under 35 U.S.C. 154(b) by 605 days.

(21) Appl. No.: 17/161,591

(22) Filed: Jan. 28, 2021

(65) Prior Publication Data

US 2021/0242393 A1 Aug. 5, 2021

Related U.S. Application Data

(60) Provisional application No. 62/968,042, filed on Jan. 30, 2020.

(51) Int. Cl.
*H01L 41/107* (2006.01)
*G01L 1/16* (2006.01)
(Continued)

(52) U.S. Cl.
CPC .............. *H10N 30/40* (2023.02); *G01L 1/16* (2013.01); *G06F 3/044* (2013.01); *H04R 17/00* (2013.01);
(Continued)

(58) Field of Classification Search
CPC .... H10N 30/40; H10N 30/8542; H10N 30/87; G01L 1/16; H04R 17/00
See application file for complete search history.

(56) References Cited

U.S. PATENT DOCUMENTS 4,412,544 A 11/1983 Beretsky et al.
8,676,540 B1 3/2014 Welch et al.
(Continued)

FOREIGN PATENT DOCUMENTS

WO WO2018077761 5/2018

*Primary Examiner* — Bryan P Gordon
(74) *Attorney, Agent, or Firm* — Perkins Coie LLP

(57) ABSTRACT

A system includes a piezoelectric capacitor assembly and signal processing circuitry coupled to the piezoelectric capacitor assembly. The piezoelectric capacitor assembly includes a piezoelectric member and piezoelectric capacitors located at respective lateral positions along the piezoelectric member. Each piezoelectric capacitor includes: (1) a respective portion of the piezoelectric member, (2) a first electrode, and (3) a second electrode. The first and second electrodes are positioned on opposite side of the piezoelectric member. The piezoelectric capacitors include piezoelectric force-measuring elements (PFEs). The PFEs are configured to output voltage signals between the respective first electrode and the respective second electrode in accordance with a time-varying strain at the respective portion of the piezoelectric member between the respective first electrode and the respective second electrode resulting from a low-frequency mechanical deformation. The signal processing circuitry is configured to read at least some of the PFE voltage signals.

41 Claims, 13 Drawing Sheets

(51) Int. Cl.
  *G06F 3/044* (2006.01)
  *H04R 17/00* (2006.01)
  *H10N 30/40* (2023.01)
  *H10N 30/853* (2023.01)
  *H10N 30/87* (2023.01)

(52) U.S. Cl.
  CPC ......... *H10N 30/8542* (2023.02); *H10N 30/87* (2023.02)

(56) References Cited

U.S. PATENT DOCUMENTS

| | | |
|---|---|---|
| 10,466,844 B1 | 10/2019 | Tang et al. |
| 10,585,534 B2 | 3/2020 | Tang et al. |
| 10,719,175 B2 | 7/2020 | Akhbari et al. |
| 10,775,938 B2 | 9/2020 | Tang et al. |
| 2001/0000666 A1 | 5/2001 | Wood et al. |
| 2002/0005108 A1 | 1/2002 | Ludwig |
| 2003/0144814 A1 | 7/2003 | Hama et al. |
| 2003/0217873 A1 | 11/2003 | Paradiso et al. |
| 2003/0233233 A1 | 12/2003 | Hong |
| 2007/0260425 A1 | 11/2007 | Kim |
| 2008/0316184 A1 | 12/2008 | D'Souza |
| 2009/0157206 A1 | 6/2009 | Weinberg et al. |
| 2009/0224161 A1 | 9/2009 | Fritsch et al. |
| 2010/0117993 A1 | 5/2010 | Kent |
| 2010/0139991 A1 | 6/2010 | Phillip et al. |
| 2010/0242242 A1* | 9/2010 | Shimizu ............. H10N 30/2042 29/25.35 |
| 2010/0258361 A1 | 10/2010 | Yamauchi et al. |
| 2011/0061464 A1 | 3/2011 | Yi-Min |
| 2012/0206014 A1* | 8/2012 | Bibl ..................... B06B 1/0207 310/330 |
| 2012/0274609 A1 | 11/2012 | Sheng et al. |
| 2013/0345864 A1 | 12/2013 | Park et al. |
| 2014/0022189 A1 | 1/2014 | Sheng et al. |
| 2014/0071095 A1 | 3/2014 | Godsill |
| 2014/0187957 A1* | 7/2014 | Rice ......................... A61B 8/12 29/25.35 |
| 2015/0148674 A1 | 5/2015 | Park et al. |
| 2015/0169136 A1 | 6/2015 | Ganti et al. |
| 2015/0345987 A1* | 12/2015 | Hajati ................... G01N 29/34 73/661 |
| 2016/0107194 A1* | 4/2016 | Panchawagh ......... B06B 1/0666 310/317 |
| 2016/0216794 A1 | 7/2016 | Yoon et al. |
| 2016/0246449 A1 | 8/2016 | Jarske |
| 2017/0110504 A1 | 4/2017 | Panchawagh et al. |
| 2017/0255338 A1 | 9/2017 | Medina |
| 2017/0318399 A1* | 11/2017 | Meskens ............... H04R 25/554 |
| 2017/0322290 A1 | 11/2017 | Ng et al. |
| 2017/0328870 A1* | 11/2017 | Garlepp ................ G11C 19/38 |
| 2017/0336903 A1 | 11/2017 | Rivaud et al. |
| 2017/0336926 A1 | 11/2017 | Chaudhri et al. |
| 2018/0032161 A1 | 2/2018 | Shi et al. |
| 2018/0032211 A1 | 2/2018 | King |
| 2018/0039392 A1 | 2/2018 | Kim et al. |
| 2018/0164937 A1 | 6/2018 | Lynn |
| 2018/0246612 A1 | 8/2018 | Lynn et al. |
| 2018/0276439 A1 | 9/2018 | Strohmann et al. |
| 2018/0276440 A1 | 9/2018 | Strohmann et al. |
| 2018/0284892 A1 | 10/2018 | Kwon et al. |
| 2018/0323783 A1 | 11/2018 | Bang et al. |
| 2019/0050618 A1 | 2/2019 | Khuri-Yakub |
| 2019/0074833 A1 | 3/2019 | Sheng |
| 2019/0354209 A1 | 11/2019 | Tang et al. |
| 2019/0354210 A1 | 11/2019 | Akhbari et al. |
| 2019/0354237 A1 | 11/2019 | Tang et al. |
| 2019/0354238 A1 | 11/2019 | Akhbari et al. |
| 2021/0181041 A1 | 6/2021 | Tang |
| 2021/0239553 A1 | 8/2021 | Akhbari et al. |
| 2021/0278926 A1 | 9/2021 | Akhbari et al. |
| 2021/0293641 A1 | 9/2021 | Tu et al. |
| 2021/0293648 A1 | 9/2021 | Tu et al. |

\* cited by examiner

SYSTEM INCLUDING PIEZOELECTRIC CAPACITOR ASSEMBLY HAVING FORCE-MEASURING, TOUCH-SENSING, AND HAPTIC FUNCTIONALITIES

CROSS-REFERENCE TO RELATED APPLICATION(S)

This application claims the benefit of U.S. Provisional Patent Application No. 62/968,042 filed on Jan. 30, 2020, entitled SYSTEMS HAVING FORCE-MEASURING, TOUCH-SENSING, AND HAPTIC FUNCTIONALITIES which is incorporated herein by reference in its entirety.

BACKGROUND

With advancements in microelectromechanical systems (MEMS) technologies, it has become possible to fabricate MEMS chips containing arrays of piezoelectric micromechanical ultrasonic transducers (PMUTs). For example, a PMUT can be configured as a transmitter (ultrasonic transmitter) or a receiver (ultrasonic receiver). Accordingly, a MEMS chip containing a PMUT array can be configured to sense touch. However, in some use cases, it would be preferable to enable touch-sensing over a larger area, including areas that exceed a lateral area of a typical MEMS chips. Additionally, in certain cases, systems that can concurrently carry out force-measuring, touch-sensing, and haptic functionalities are desirable.

SUMMARY OF THE INVENTION

In one aspect, a system includes a piezoelectric capacitor assembly and signal processing circuitry coupled to the piezoelectric capacitor assembly. The piezoelectric capacitor assembly includes a piezoelectric member and piezoelectric capacitors located at respective lateral positions along the piezoelectric member. Each piezoelectric capacitor includes: (1) a respective portion of the piezoelectric member, (2) a first electrode, and (3) a second electrode. The first electrode and the second electrode are positioned on opposite sides of the piezoelectric member. The piezoelectric capacitors include piezoelectric force-measuring elements (PFEs). The PFEs are configured to output voltage signals between the respective first electrode and the respective second electrode in accordance with a time-varying strain at the respective portion of the piezoelectric member between the respective first electrode and the respective second electrode resulting from a low-frequency mechanical deformation. The signal processing circuitry is configured to read at least some of the PFE voltage signals.

In another aspect, a system includes a cover layer, a piezoelectric capacitor assembly coupled to the inner surface of the cover layer, and signal processing circuitry coupled to the piezoelectric capacitor assembly. The piezoelectric capacitor assembly includes a piezoelectric member and piezoelectric capacitors located at respective lateral positions along the piezoelectric member. Each piezoelectric capacitor includes: (1) a respective portion of the piezoelectric member, (2) a first electrode, and (3) a second electrode. The first electrode and the second electrode are positioned on opposite sides of the piezoelectric member. The piezoelectric capacitors include one or more piezoelectric force-measuring elements (PFEs) and one or more piezoelectric ultrasonic transducers (PUTs).

In yet another aspect, a system includes a piezoelectric capacitor assembly and signal processing circuitry coupled to the piezoelectric capacitor assembly. The piezoelectric capacitor assembly includes a piezoelectric member and one or more piezoelectric capacitors located at respective lateral positions along the piezoelectric member. Each piezoelectric capacitor includes: (1) a respective portion of the piezoelectric member, (2) a first electrode, and (3) a second electrode. The first electrode and the second electrode are positioned on opposite sides of the piezoelectric member. Each of the piezoelectric capacitors is configurable by the signal processing circuitry as one or more of the following: piezoelectric force-measuring element (PFE), piezoelectric ultrasonic transducer (PUT) in transmit mode, PUT in receive mode, and haptic transmitter.

The above summary is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to systems including piezoelectric capacitor assemblies having force-measuring, touch-sensing, and haptic functionalities.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
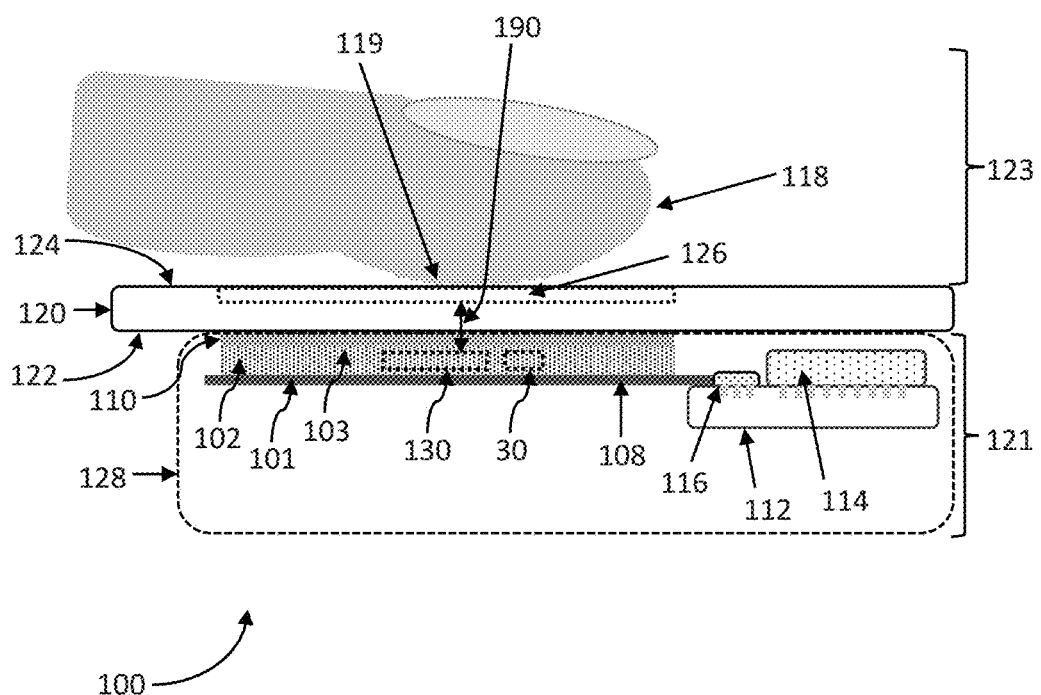
FIG. 1 is a schematic view of an illustrative input system including a piezoelectric capacitor assembly.

FIG. 1 is a schematic view of a system or an apparatus 100, referred to herein as an input system. In the example shown, the system 100 includes a piezoelectric capacitor assembly 102 containing piezoelectric capacitors. The piezoelectric capacitors can be configured as piezoelectric force-measuring elements (PFEs), piezoelectric ultrasonic transducers (PUTs), and haptic transmitters, as explained hereinbelow. The piezoelectric capacitor assembly 102 is mounted to a flexible circuit substrate 108 (e.g., an FPC or flexible printed circuit) located at its bottom surface 101. The flexible circuit substrate 108 is electrically and mechanically connected to a printed circuit board (PCB) 112 via a connector 116. Integrated circuits (ICs) 114 are mounted on the PCB 112. ICs 114 contain signal processing circuitry that is coupled to (electrically connected to) the piezoelectric capacitor assembly 102. The signal processing circuitry can be implemented in a single IC or in multiples ICs. In an alternative implementation, the ICs can be mounted on the flexible circuit substrate 108 instead of or in addition to being mounted on the PCB 112. ICs 114 contain semiconductor substrates and signal processing circuitry formed on or in the semiconductor substrates. In the example shown in FIG. 1, the piezoelectric capacitor assembly 102 and the ICs 114 are separate components. In other examples, piezoelectric capacitors can be integrated into an IC by using MEMS technologies. ICs 114 can include a microcontroller (MCU), microprocessor (MPU), and/or a digital signal processor (DSP), for example. These ICs 114 could be used to run programs and algorithms to analyze and categorize events based on data received from the piezoelectric capacitor assembly 102.

Input system 100 includes a cover layer 120 having an exposed outer surface 124 and an inner surface 122 opposite the outer surface 124. The outer surface can be touched by a digit (e.g., a finger). The cover layer should be robust but should be sufficiently deformable, such that a deformation of the cover layer is transmitted to the piezoelectric capacitors in the piezoelectric capacitor assembly 102, as described with reference to FIGS. 7, 8, and 9. If any of the piezoelectric capacitors are configured as ultrasonic transducers, the cover layer can be a material that transmits ultrasound waves. Examples of robust materials that transmit ultrasound waves are wood, glass, metal, plastic, leather, fabric, and ceramic. The cover layer 120 could also be a composite stack of any of the foregoing materials. At its top surface 103, the piezoelectric capacitor assembly 102 is adhered to or attached to (generally, coupled to) the inner surface 122 of the cover layer 120 by a layer of adhesive 110, for example. The choice of adhesive 110 is not particularly limited as long as the piezoelectric capacitors remains attached to the cover layer. The adhesive 110 could be double-sided tape, pressure sensitive adhesive (PSA), epoxy adhesive, or acrylic adhesive, for example. In operation, at least some of the piezoelectric ultrasonic transducers (PUTs) in piezoelectric capacitor assembly 102 generate ultrasound waves in longitudinal modes that propagate along a normal direction 190, shown in FIG. 1 as being approximately normal to the exposed outer surface 124 and the inner surface 122 of the cover layer. The normal direction 190 is approximately normal to a piezoelectric member 160 as explained in greater detail hereinbelow. At least some of the generated ultrasound waves exit the piezoelectric capacitor assembly 102 through the top surface 103, travel through the adhesive layer 110, then through the inner surface 122, and then through the cover layer 120. The ultrasound waves reach a sense region 126 of the exposed outer surface 124. The sense region 126 is a region of the exposed outer surface 124 that overlaps the piezoelectric capacitor assembly 102.

FIG. 1 illustrates a use case in which a human finger 118 is touching the cover layer 120 at the sense region 126. If there is no object touching the sense region 126, the ultrasound waves that have propagated through the cover layer 120 are reflected at the exposed outer surface 124 (at the air-material interface) and the remaining echo ultrasound waves travel back toward the PUTs in piezoelectric capacitor assembly 102. On the other hand, if there is a finger 118 touching the sense region 126, there is relatively large attenuation of the ultrasound waves by absorption through the finger 118. As a result, it is possible to detect a touch event by measuring the relative intensity or energy of the echo ultrasound waves that reach the PUTs in the piezoelectric capacitor assembly 102.

It is possible to distinguish between a finger touching the sense region 126 and a water droplet landing on the sense region 126, for example. When a finger touches the sense region 126, the finger would also exert a force on the cover layer 120. The force exerted by the finger on the cover layer can be detected and measured using the piezoelectric force-measuring elements (PFEs). On the other hand, when a water droplet lands on the sense region, the force exerted by the water droplet as measured at the PFEs would be quite small, and likely less than a noise threshold. More generally, it is possible to distinguish between a digit that touches and presses the sense region 126 and an inanimate object that comes into contact with the sense region 126.

System 100 can be implemented in numerous apparatuses. For example, the system 100 can replace conventional buttons on Smartphones, keys on computer keyboards, sliders, or track pads. The interior contents 128 of system 100 (e.g., piezoelectric capacitor assembly 102, circuit substrate 108, connector 116, PCB 112, ICs 114) can be sealed off from the exterior 123 of the cover layer 120, so that liquids on the exterior 123 cannot penetrate into the interior 121 of the system 100. The ability to seal the interior of the system from the outside helps to make an apparatus, such as a Smartphone or laptop computer, waterproof. There are some applications, such as medical applications, where waterproof buttons and keyboards are strongly desired. The apparatus can be a mobile appliance (e.g., Smartphone, tablet computer, laptop computer), a household appliance (e.g., television, washing machine, dryer, light switches, air conditioner, refrigerator, oven, remote controller devices), a medical appliance, an industrial appliance, an office appliance, an automobile, or an airplane, for example.

Figure 2:
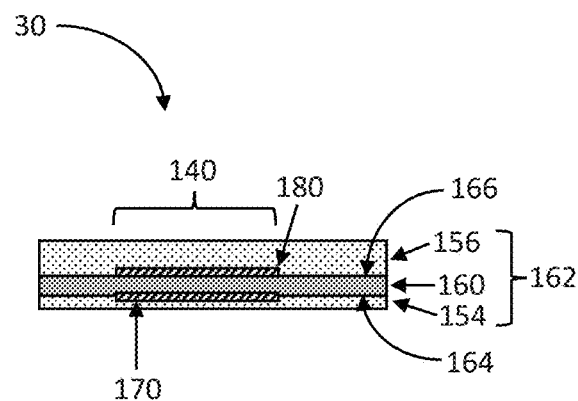
FIGS. 2 and 3 are schematic cross-sectional views of a certain portion of the piezoelectric capacitor assembly of FIG. 1, according to different embodiments.
Figure 3:
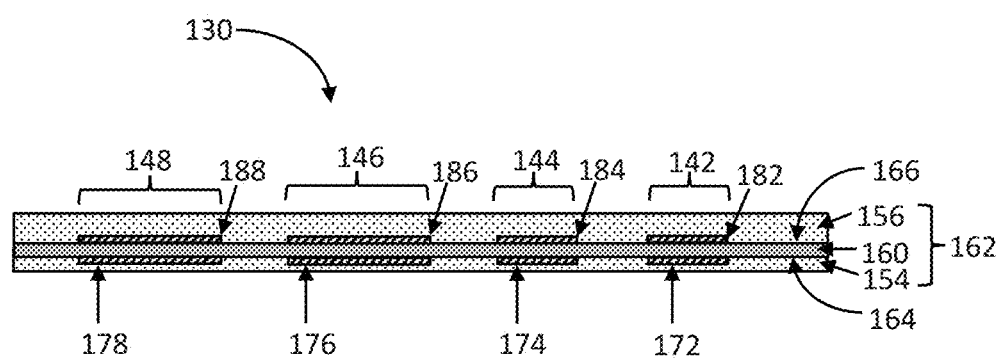

Portions 30 and 130 of the piezoelectric capacitor assembly 102 in accordance with different embodiments is shown in more detailed cross-sectional view in FIGS. 2 and 3. FIG. 2 shows a portion 30 containing a piezoelectric capacitor 140. A piezoelectric member 160 extends laterally across the piezoelectric capacitor assembly. The piezoelectric member 160 is a member exhibiting the piezoelectric effect. The piezoelectric member can be a piezoelectric film. The piezoelectric member can be a freestanding piezoelectric film. Suitable materials for the piezoelectric member 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. In the example shown, the piezoelectric member 160 can be a film of PZT or PVDF having a thickness in a range of 1 μm to 1 mm. For example, the piezoelectric member 160 can be a freestanding film of PZT. The piezoelectric member 160 has a top major surface 166 and a bottom major surface 164 opposite the top major surface 166. In the example shown, a top mechanical layer 156 is disposed adjacent to or attached to (generally, coupled to) top major surface 166, and a bottom mechanical layer 154 is disposed adjacent to or attached to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric member 160, which in this case is PZT or PVDF. In the example shown, the top mechanical layer and the bottom mechanical layer contain the same material. In other examples, the top mechanical layer and the bottom mechanical layer are of different materials. In other examples, the top mechanical layer and/or the bottom mechanical layer can be omitted. The piezoelectric member 160, in combination with any mechanical layers (154, 156) attached (generally, coupled) to it, is sometimes referred to as a piezoelectric stack 162. The mechanical layer(s) can be used to adjust the mechanical properties of the piezoelectric stack 162. If the piezoelectric member 160 is thin, the mechanical layer(s) could improve the strength of the piezoelectric stack 162. The mechanical layer(s) can also be used to adjust the frequency bandwidths or other frequency characteristics of transducers (PUTs, haptic transmitters) that incorporate the piezoelectric stack 162. When coupled to the cover layer, the piezoelectric capacitor assembly 102 is preferably oriented such that the piezoelectric member 160 faces toward the cover layer 120. For example, the piezoelectric capacitor assembly 102 is oriented such that the piezoelectric member 160 and the cover layer 120 are approximately parallel.

For ease of discussion, only one piezoelectric capacitor is shown in FIG. 2. A piezoelectric capacitor assembly may contain one or more piezoelectric capacitors. The piezoelectric capacitor 140 is located at a respective lateral position along the piezoelectric member 160. The piezoelectric capacitor 140 includes a respective portion of the piezoelectric member 160. The piezoelectric capacitor 140 includes a first electrode 170 positioned on a first side (bottom surface) 164 of the piezoelectric member 160 and a second electrode 180 positioned on a second side (top surface) 166 opposite the first side. For each piezoelectric capacitor, the first and second electrodes are positioned on opposite sides of the piezoelectric member 160 at the respective portion of the piezoelectric member 160.

The signal processing circuitry is coupled to the piezoelectric capacitor assembly. In the example shown in FIG. 2, the piezoelectric capacitor 140 is configurable by the signal processing circuitry as one or more of the following: piezoelectric force-measuring element (PFE), piezoelectric ultrasonic transducer (PUT) in transmit mode, PUT in receive mode, and haptic transmitter. For example, at a time $T_{PFE}$, the piezoelectric capacitor 140 can be configured as a PFE; at another time $T_{Tx}$, the piezoelectric capacitor 140 can be configured as a PUT in transmit mode; at yet another time $T_{Rx}$, the piezoelectric capacitor 140 can be configured as a PUT in receive mode; and at yet another time $T_H$, the piezoelectric capacitor 140 can be configured as a haptic transmitter. A PUT in transmit mode is also referred to as a PUT transmitter and a PUT in receive mode is also referred to as a PUT receiver.

A portion 130 of the piezoelectric capacitor assembly 102 in accordance with another embodiment is shown in more detailed cross-sectional view in FIG. 3. FIG. 3 shows four piezoelectric capacitors: a PUT transmitter 142, a PUT receiver 144, a PFE 146, and a haptic transmitter 148. The piezoelectric capacitors 142, 144, 146, and 148 are located at respective lateral positions along the piezoelectric member 160, which extends laterally across the piezoelectric capacitor assembly. Each piezoelectric capacitor includes a respective portion of the piezoelectric member 160. Each piezoelectric capacitor (142, 144, 146, 148) includes a first electrode (172, 174, 176, 178) positioned on a first side (bottom surface) 164 of the piezoelectric member 160 and a second electrode (182, 184, 186, 188) positioned on a second side (top surface) 166 opposite the first side. For each piezoelectric capacitor, the first and second electrodes are positioned on opposite sides of the piezoelectric member 160 at the respective portion of the piezoelectric member 160. The signal processing circuitry is coupled to the piezoelectric capacitor assembly. The PUTs, PFEs, and haptic transmitters can be referred to as transducers. In the case that the piezoelectric member 160 is freestanding (e.g., freestanding piezoelectric film), the transducers can be bulk transducers for example.

For ease of discussion, FIG. 3 shows four piezoelectric capacitors. A piezoelectric capacitor assembly may have one or more piezoelectric capacitors. FIG. 3 shows one of each of the PUT transmitters, PUT receivers, PFEs, and haptic transmitters. However, a piezoelectric capacitor assembly may contain a plurality of PUT transmitters, PUT receivers, PFEs, and haptic transmitters. A piezoelectric capacitor assembly need not contain any PUT transmitters, PUT receivers, or haptic transmitters. A system incorporating a piezoelectric capacitor assembly containing PFEs can be referred to as a force-measuring system. A system incorporating a piezoelectric capacitor assembly comprising PFEs, PUT transmitters, and PUT receivers can be referred to as a force-measuring and touch-sensing system. A system incorporating a piezoelectric capacitor assembly containing PFEs, PUT transmitters, PUT receivers, and haptic transmitters can be referred to as a system having force-measuring, touch-sensing, and haptic functionalities.

Figure 4:
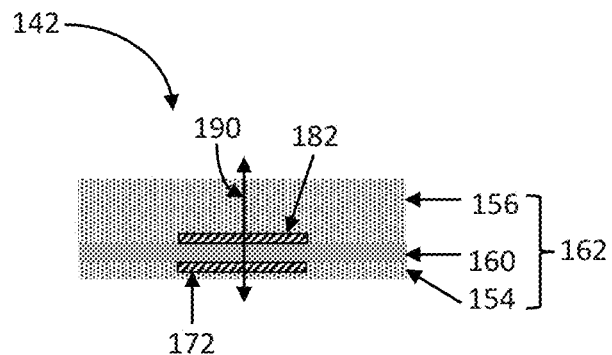
FIG. 4 is schematic cross-sectional view of a piezoelectric ultrasonic transducer (PUT) configured to transmit.

In the example shown in FIG. 3, one of the PUTs is configured as a transmitter (142) and another of the PUTs is configured as a receiver (144). It would also be possible for the signal processing circuitry to configure one or more PUTs as a transmitter at a time $T_{Tx}$ and to configure the one or more PUTs as a receiver at another time $T_{Rx}$. The PUT transmitter 142 is shown in cross section in FIG. 4. In the example shown, the thickness of the top mechanical layer 156 is greater than the thickness of the bottom mechanical layer 154. The PUT transmitter 142 can be in a quiescent state, in which the signal processing circuitry applies no voltage (zero voltage) between the first PUT transmitter electrode 172 and the second PUT transmitter electrode 182. The piezoelectric member 160 has a built-in polarization (piezoelectric polarization) that is approximately normal to a plane of the piezoelectric member 160 (or parallel to normal direction 190). Normal direction 190 is approximately normal to the piezoelectric member 160. At a piezoelectric capacitor (e.g., PUT transmitter 142), the normal direction 190 is approximately normal to the electrodes (e.g., 172, 182) of the piezoelectric capacitor (e.g., PUT transmitter 142). The signal processing circuitry applies time-varying voltage signals $V_{Tx}(t)$ between the PUT transmitter electrodes (172, 182), which causes the portion of the piezoelectric member 160 between the PUT transmitter electrodes (172, 182) to undergo expansion and compression. If the time-varying voltage signals $V_{Tx}(t)$ oscillates between voltage extrema at a certain frequency, the respective portion of the piezoelectric member 160 oscillates between the expanded state and compressed state at that frequency. As a result, the PUT transmitter generates (transmits), upon application of the time-varying voltage signal, ultrasound signals propagating along the normal direction 190. At least some of the ultrasound signals propagate toward the sense region 126 of the outer surface 124.

Figure 5:
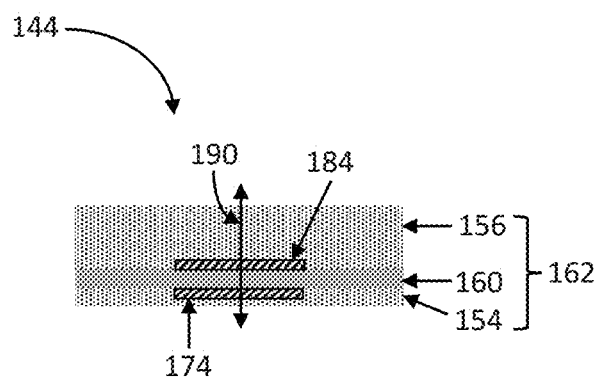
FIG. 5 is a schematic cross-sectional view of a piezoelectric ultrasonic transducer (PUT) configured to receive.

The PUT receiver 144 is shown in cross section in FIG. 5. The PUT receiver 144 can be in a quiescent state, in which there is no deformation of the piezoelectric member 160. In the quiescent state, there is no voltage (zero voltage) generated between the PUT receiver electrodes (174, 184). When an ultrasound pressure wave is incident on the PUT receiver, for example downwards along the normal direction, the piezoelectric member 160 including the portion between the PUT receiver electrodes (174, 184) oscillates between a compressed state, under a positive ultrasound pressure wave, and an expanded state, under a negative ultrasound pressure wave. As a result, a time-varying voltage signal $V_{Rx}(t)$ is generated between the PUT receiver electrodes (174, 184). Some of these time-varying voltage signals $V_{Rx}(t)$ are read, amplified, and processed by the signal processing circuitry.

In the example shown in FIG. 3, the piezoelectric capacitors include one or more PUTs. For at least one of the PUTs, the signal processing circuitry is configured to generate first transmitter voltage signals (time-varying voltage signals $V_{Tx}(t)$) that are applied between the respective first electrode and the second electrode of the respective PUT, upon which the respective PUT transmits ultrasound signals of a first frequency $F_1$, in longitudinal mode(s) propagating along a normal direction approximately normal to the piezoelectric member. At least some of the ultrasound signals travel towards the sense region 126 of the outer surface 124. In the example shown, the at least one PUT is PUT 142 which is configured as a PUT transmitter. Preferably, the first frequency $F_1$ is a frequency in a range of 0.1 MHz to 25 MHz.

Similarly, in the example shown in FIG. 2, each piezoelectric capacitor is configurable by the signal processing circuitry as one or more of the following: piezoelectric force-measuring element (PFE), piezoelectric ultrasonic transducer (PUT) in transmit mode, PUT in receive mode, and haptic transmitter. When a respective piezoelectric capacitor is configured as a PUT in transmit mode, the signal processing circuitry is configured to generate first transmitter voltage signals (that are applied between the respective first electrode and the second electrode of the respective piezoelectric capacitor, upon which the respective piezoelectric capacitor transmits ultrasound signals of a first frequency $F_1$, in longitudinal mode(s) propagating along a normal direction approximately normal to the piezoelectric member. At least some of the ultrasound signals travel towards the sense region 126 of the outer surface 124. Preferably, the first frequency $F_1$ is a frequency in a range of 0.1 MHz to 25 MHz.

In the example shown in FIG. 3, at least one of the PUTs is configured to output first receiver voltage signals (time-varying voltage signals $V_{Rx}(t)$) between the respective first electrode and the respective second electrode in response to ultrasound signals of the first frequency $F_1$ arriving at the respective PUT along the normal direction. In response to ultrasound signals of the first frequency F 1 arriving along the normal direction, the respective portion of the piezoelectric member at the respective PUT oscillates at the first frequency $F_1$. In the example shown, the at least one PUT is PUT 144 which is configured as a PUT receiver. Some fraction of the ultrasound signals transmitted by the PUT transmitter 142 returns to the PUT receiver 144 as an echo ultrasound signal. In the use case illustrated in FIG. 1, the relative amplitude or energy of the echo ultrasound signal depends upon the presence of a digit (e.g., human finger) or other object (e.g., water drop) touching the sense region 126. If the sense region 126 is touched by a digit or other object, there is greater attenuation of the echo ultrasound signal than if there is no touching at the sense region 126. The signal processing circuitry is configured to read at least some of the first receiver voltage signals. By amplifying and processing the time-varying voltage signals from the PUT receiver(s) at the signal processing circuitry, these touch events can be detected. In the example shown in FIG. 2, when a respective piezoelectric capacitor is configured as a PUT in receive mode, the piezoelectric capacitor operates similarly to the PUT receiver 144 of FIG. 3.

Figure 6:
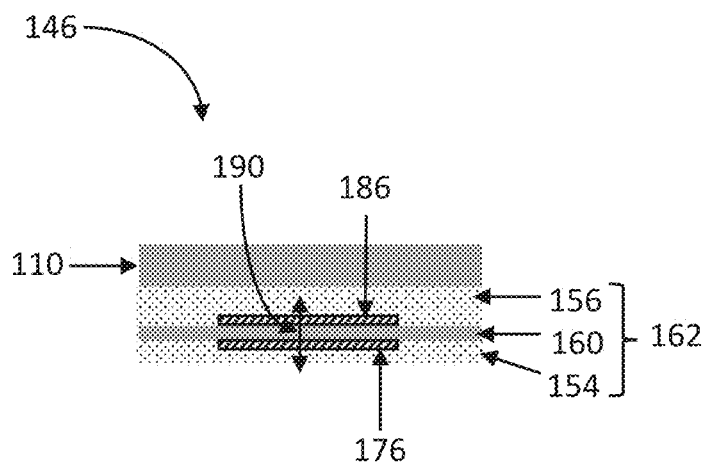
FIG. 6 is a schematic cross-sectional view of a piezoelectric force-measuring element (PFE).

The PFE 146 is shown in cross section in FIG. 6. Also shown is the portion of the adhesive 110 that is above the PFE 146. The adhesive 110 adheres the piezoelectric capacitor assembly 102 to the inner surface 122 of the cover layer 120 (FIG. 1). FIG. 6 shows the PFE 146 in a quiescent state, in which there is no deflection of the piezoelectric stack 162. In the quiescent state, there is no voltage generated between the PFE electrodes (176, 186).

Figure 7:
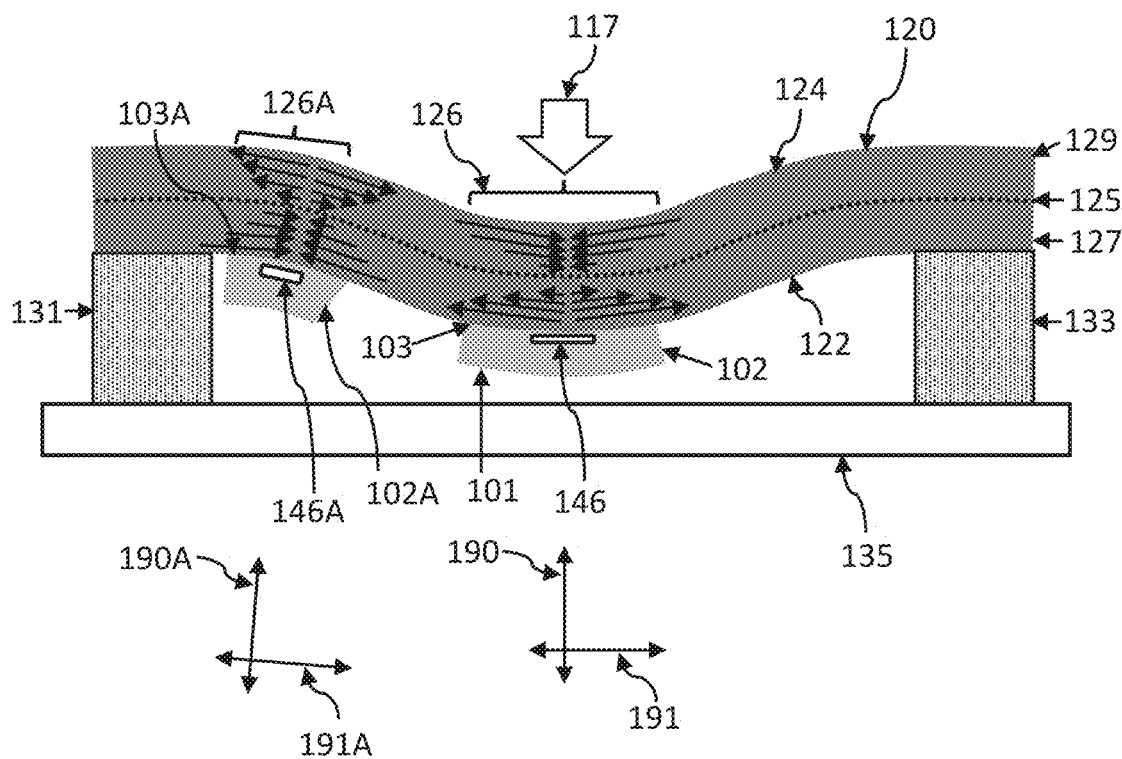
FIGS. 7, 8, and 9 are schematic side views of a piezoelectric capacitor assembly and a cover layer, attached to each other and undergoing deformation.
Figure 8:
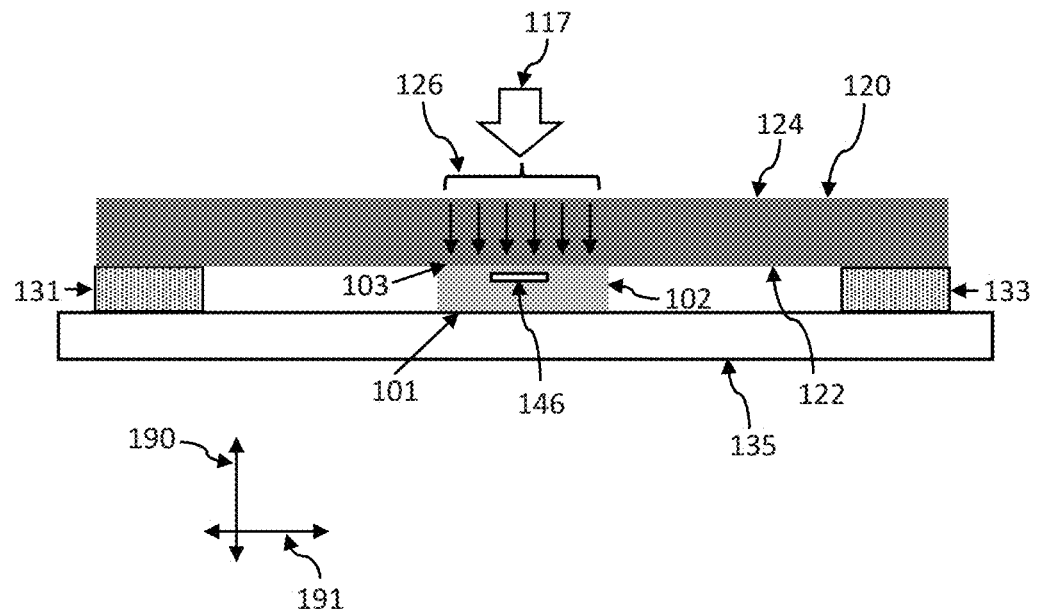
Figure 9:
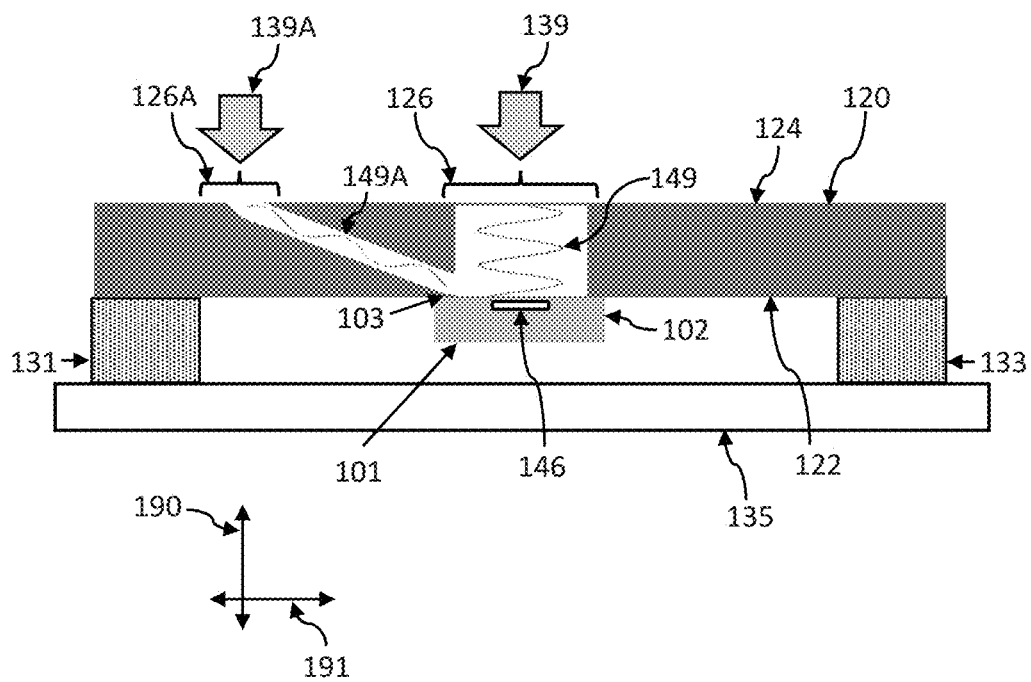

FIGS. 7, 8, and 9 are schematic side views of a piezoelectric capacitor assembly 102 and a cover layer 120 attached to or adhered to (coupled to) each other. A top surface 103 of piezoelectric capacitor assembly 102 is coupled to inner surface 122 of the cover layer 120. Piezoelectric capacitor assembly 102 and cover layer 120 overlie a rigid substrate 135. For ease of viewing, other components of system 100 (e.g., flexible circuit substrate 108, ICs 114) have been omitted. Piezoelectric capacitor assembly 102 includes PFEs 146. In the example shown, two anchor posts 131, 133 fix the two ends of the cover layer 120 to the substrate 135.

In the example of FIG. 7, piezoelectric capacitor assembly 102 is not anchored to the rigid substrate 135 and can move with the cover layer 120 when the cover layer 120 is deflected upwards or downwards. A downward force 117, shown as a downward arrow, is exerted by a digit (or another object) pressing against the outer surface 124 of the cover layer 120 at the sense region 126 for example. A digit pressing against or tapping the outer surface 124 are examples of touch excitation. In the example shown in FIG. 7, the cover layer 120 is deflected in a first direction (e.g., downwards) in response to a touch excitation at the sense region 126. Piezoelectric capacitor assembly 102 is located approximately half-way between the anchor posts 131, 133 and sense region 126 overlaps piezoelectric capacitor assembly 102. A neutral axis 125 is located within the cover layer 120. A lower portion 127 of the cover layer 120, below the neutral axis 125, is under tensile (positive) strain at the sense region 126, represented by outward pointing arrows, primarily along lateral direction 191, perpendicular to the normal direction 190. The lateral direction 191 is approximately parallel to the piezoelectric member 160 at the respective location of the piezoelectric member 160 (at region 126). An upper portion 129 of the cover layer 120, above the neutral axis 125, is under compressive (negative) strain at the sense region 126, represented by inward pointing arrows, primarily along lateral direction 191. Since piezoelectric capacitor assembly 102 is coupled to the inner surface 122, adjacent to the lower portion 127, the PFEs 146 are also under tensile (positive) strain. Typically, the entire piezoelectric capacitor assembly 102 may be deflected under the applied downward force 117. In the example shown in FIG. 7, the PFEs 146 are under positive strain, and the respective portions of the piezoelectric member 160 at the PFEs (146) undergo expansion along a lateral direction 191. As a result, an electrical charge is generated at each PFE (146) between the respective PFE electrodes (176, 186). This electrical charge is detectable as a first deflection voltage $V_{d1}$ (corresponding to strain of a certain polarity and magnitude). The polarity of the first deflection voltage Val at a PFE depends upon the polarity of the strain (positive strain (tensile) or negative strain (compressive)) at the respective portion of the piezoelectric member between the respective PFE electrodes of the PFE. The magnitude of the first deflection voltage $V_{d1}$ at a PFE depends upon the magnitude of the strain at the respective portion of the piezoelectric member between the respective PFE electrodes of the PFE. Subsequently, when the downward force 117 is no longer applied to the sense region 126, the cover layer 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PFE depends upon the polarity of the strain at the respective portion of the piezoelectric member between the respective PFE electrodes of the PFE. The magnitude of the second deflection voltage $V_{d2}$ at a PFE depends upon the magnitude of the strain at the respective portion of the piezoelectric member between the respective PFE electrodes of the PFE.

FIG. 7 shows a second piezoelectric capacitor assembly 102A, including PFEs 146A. A top surface 103A of piezoelectric capacitor assembly 102A is coupled to inner surface 122 of the cover layer 120. Piezoelectric capacitor assembly 102A overlies the rigid substrate 135 and is located at a second region 126A, between anchor post 131 and first piezoelectric capacitor assembly 102. Note that piezoelectric capacitor assembly 102A is laterally displaced from the location where the downward force 117 is applied to the outer surface 124 (at sense region 126). The lower portion 127 of the cover layer 120 is under compressive (negative) strain at the second region 126A, represented by inward pointing arrows, primarily along the lateral direction 191A, perpendicular to the normal direction 190A. The lateral direction 191A is approximately parallel to the piezoelectric member 160 at the respective location of the piezoelectric member 160 (at second region 126A). The upper portion 129 of the cover layer 120 is under tensile (positive) strain at the second region 126A, represented by outward pointing arrows, primarily along the lateral direction 191A. Since piezoelectric capacitor assembly 102A is coupled to the inner surface 122, adjacent to the lower portion 127, the PFEs 146A are also under compressive (negative) strain. These examples illustrate that when the cover layer and the piezoelectric capacitor assembly undergo deflection in response to a touch excitation at the outer surface, expansion and/or compression of the piezoelectric member along the lateral direction may be induced by the deflection of the cover layer.

In the example shown in FIG. 8, the bottom surface 101 of piezoelectric capacitor assembly 102 is anchored to the rigid substrate 135. When downward force 117 is applied to the cover layer 120 at sense region 126, the portion of the cover layer 120 at the sense region 126 transmits the downward force along normal direction 190. The portion of the cover layer 120 at the sense region 126 and the piezoelectric capacitor assembly 102 undergo compression along normal direction 190. Consequently, the PFEs 146 including piezoelectric member 160 are compressed along the normal direction 190, approximately normal to the piezoelectric member 160. As a result, an electrical charge is generated between the PFE electrodes (176, 186). This electrical charge is detectable as a voltage V c (corresponding to strain of a certain polarity and magnitude) between the PFE electrodes. The downward force 117 that causes this compression is applied during a touch excitation, such as tapping at or pressing against the outer surface 124. The pressing or the tapping can be repetitive. Typically, the entire piezoelectric capacitor assembly 102 may undergo compression. Subsequently, the piezoelectric member 160 relaxes from the compressed state. In other cases, there may also be compression along a lateral direction 191, or along other directions.

In the example shown in FIG. 9, piezoelectric capacitor assembly 102 is not anchored to the rigid substrate 135. A downward force 139, shown as a downward arrow, is applied to the outer surface 124 of the cover layer 120 at the sense region 126. The downward force 139 is generated as a result of an impact of touch excitation at the sense region 126. For example, the downward force 139 is generated as a result of the impact of a digit (or another object) tapping the outer surface at the sense region 126. The touch excitation (e.g., tapping) can be repetitive. The impact of the touch excitation (e.g., tapping) generates elastic waves that travel outward from the location of the impact (on the outer surface 124 at sense region 126) and at least some of the elastic waves travel towards the inner surface 122. Accordingly, at least some portion 149 of the elastic waves are incident on the piezoelectric capacitor assembly 102.

In general, an impact of a touch excitation (e.g., tapping) on a surface of a stack (e.g., cover layer) can generate different types of waves including pressure waves, shear waves, surface waves and Lamb waves. Pressure waves, shear waves, surface waves, and Lamb waves are in a class of waves called elastic waves. Pressure waves (also called primary waves or P-waves) are waves in which the molecular oscillations (particle oscillations) are parallel to the direction of propagation of the waves. Shear waves (also called secondary waves or S-waves) are waves in which the molecular oscillations (particle oscillations) are perpendicular to the direction of propagation of the waves. Pressure waves and shear waves travel radially outwards from the location of impact. Surface waves are waves in which the energy of the waves are trapped within a short depth from the surface and the waves propagate along the surface of the stack. Lamb waves are elastic waves that can propagate in plates. When an object (e.g., a finger) impacts a surface of a stack, different types of elastic waves can be generated depending upon the specifics of the impact (e.g., speed, angle, duration of contact, details of the contact surface), the relevant material properties (e.g., material properties of the object and the stack), and boundary conditions. For example, pressure waves can be generated when an impact of a touch excitation at the outer surface is approximately normal to the outer surface. For example, shear waves can be generated when an impact of a touch excitation at the outer surface has a component parallel to the outer surface, such as a finger hitting the outer surface at an oblique angle or a finger rubbing against the outer surface. Some of these elastic waves can propagate towards the piezoelectric capacitor assembly 102 and PFEs 146. If the stack is sufficiently thin, then some portion of surface waves can propagate towards the piezoelectric capacitor assembly 102 and PFEs 146 and be detected by the PFEs 146.

Accordingly, when elastic waves 149 are incident on the piezoelectric capacitor assembly 102 and PFEs 146, the elastic waves induce time-dependent oscillatory deformation to the piezoelectric member 160 at the PFE 146. This oscillatory deformation can include: lateral deformation (compression and expansion along the lateral direction 191 approximately parallel to piezoelectric member 160), normal deformation (compression and expansion along the normal direction 190 approximately normal to the piezoelectric member 160), and shear deformation. As a result, time-varying electrical charges are generated at each PFE (146) between the respective PFE electrodes (176, 186). These time-varying electrical charges are detectable as time-varying voltage signals. The signal processing circuitry amplifies and processes these time-varying voltage signals. Typically, the time-dependent oscillatory deformations induced by an impact of a touch excitation are in a frequency range of 10 Hz to 1 MHz. For example, suppose that elastic waves 149 include pressure waves incident on the PFEs 146 along the normal direction 190; these pressure waves may induce compression (under a positive pressure wave) and expansion (under a negative pressure wave) of the piezoelectric member 160 along the normal direction 190. As another example, suppose that elastic waves 149 include shear waves incident on the PFEs 146 along the normal direction 190; these shear waves may induce compression and expansion of the piezoelectric member 160 along the lateral direction 191.

Consider another case in which a downward force 139A, shown as a downward arrow, is applied to the outer surface 124 at a second region 126A, between anchor post 131 and piezoelectric capacitor assembly 102. The downward force 139A is generated as a result of an impact of touch excitation at the second region 126A. The impact of the touch excitation generates elastic waves that travel outward from the location of the impact (region 126A) and at least some of the elastic waves travel towards the inner surface 122. Accordingly, at least some portion 149A of the elastic waves are incident on the piezoelectric capacitor assembly 102, causing the piezoelectric member 160 to undergo time-dependent oscillatory deformation. As a result, time-varying electrical charges are generated at each PFE (146) between the respective PFE electrodes (176, 186). These time-varying electrical charges are detectable as time-varying voltage signals, although the impact of the touch excitation occurred at a second region 126A that is laterally displaced from the sense region 126.

Elastic waves 149A that reach piezoelectric capacitor assembly 102 from region 126A may be weaker (smaller in amplitude) than elastic waves 149 that reach piezoelectric capacitor assembly 102 from sense region 126, because of a greater distance between the location of impact and the piezoelectric capacitor assembly 102. An array of PFEs can be configured to be a position-sensitive input device, sensitive to a location of the impact (e.g., tapping) of a touch excitation. An array of PFEs can be an array of PFEs in a single piezoelectric capacitor assembly or arrays of PFEs in multiple piezoelectric capacitor assemblies. For example, a table input apparatus could have an array of PFEs located at respective lateral positions underneath the table's top surface. The signal processing circuitry can be configured to amplify and process the time-varying voltage signals from the PFEs and analyze some features of those time-varying voltage signals. Examples of features of time-varying voltage signals are: (1) amplitudes of the time-varying voltage signals, and (2) the relative timing of time-varying voltage signals (the "time-of-flight"). For example, a PFE exhibiting a shorter time-of-flight is closer to the location of impact than another PFE exhibiting a longer time-of-flight. The signal processing circuitry can analyze features of time-varying signals (e.g., amplitude and/or time-of-flight) from the PFEs in an array of PFEs to estimate a location of impact of a touch excitation.

In operation, each PFEs is configured to output voltage signals between the PFE electrodes (176, 186) in accordance with a time-varying strain at the respective portion of the piezoelectric member 160 between the PFE electrodes (176, 186) resulting from a low-frequency mechanical deformation. A touch excitation at the cover layer or at another component mechanically coupled to the cover layer causes a low-frequency mechanical deformation (of the cover layer or other component at the point of excitation). The touch excitation induces effects including deflection (as illustrated in FIG. 7), compression (as illustrated in FIG. 8), and elastic-wave oscillations (as illustrated in FIG. 9). In an actual touch event, more than one of these effects may be observable. Consider tapping by a finger as an example of a touch excitation. As the finger impacts the outer surface 124, elastic waves are generated which are detectable as time-varying voltage signals at the PFEs (FIG. 9). Elastic waves are generated by the impact of the touch excitation. Subsequently, as the finger presses against the cover layer, the piezoelectric capacitor assembly undergoes deflection (FIG. 7). There is expansion or compression of the piezoelectric member along a lateral direction. The low-frequency mechanical deformation can be caused by a digit pressing against or tapping at the sense region 126 of the cover layer 120, to which the piezoelectric capacitor assembly 102 is attached (coupled). The PFEs 146 are coupled to the signal processing circuitry. The signal processing circuitry is configured to read at least some of the PFE voltage signals. By amplifying and processing the PFE voltage signals at the signal processing circuitry, the strain that results from the mechanical deformation of the piezoelectric member can be measured.

It is possible to adjust the relative amplitudes of the PFE voltage signals attributable to the elastic-wave oscillations (FIG. 9) and lateral expansion and compression due to deflection (FIG. 7). For example, one can choose the cover layer to be more or less deformable. For example, the cover layer 120 of FIG. 9 may be thicker and/or made of more rigid material than the cover layer 120 of FIG. 7.

PFE 146 is configured to output voltage signals between the PFE electrodes (176, 186) in accordance with a time-varying strain at the respective portion of the piezoelectric member between the PFE electrodes (176, 186) resulting from a low-frequency mechanical deformation. Typically, the low-frequency deformation is induced by touch excitation which is not repetitive (repetition rate is effectively 0 Hz) or is repetitive having a repetition rate of 100 Hz or less, or 10 Hz or less. These repetition rates correspond to the repetition rates of a repetitive touch excitation, e.g., a digit repeatedly pressing against or tapping the sense region.

A touch excitation, or more generally, excitation can occur somewhere other than at the sense region. Consider an implementation of an input system in a portable apparatus, such as a smartphone. In some cases, the cover layer, to which the piezoelectric capacitor assembly is coupled, can be a portion of the smartphone housing, and in other cases, the housing and the cover layer can be attached to each other, such that forces applied to the housing can be transmitted to the cover layer. We can refer to both cases as a component (e.g., housing) being mechanically coupled to the cover layer. Excitation such as bending of, twisting of, pinching of, typing at, and tapping at the housing can also cause low-frequency mechanical deformation. For example, typing at the housing can include typing at a touch panel of the smartphone. There can be a time-varying strain (force) at a respective portion of the piezoelectric member at a PFE resulting from this low-frequency deformation.

Figure 10:
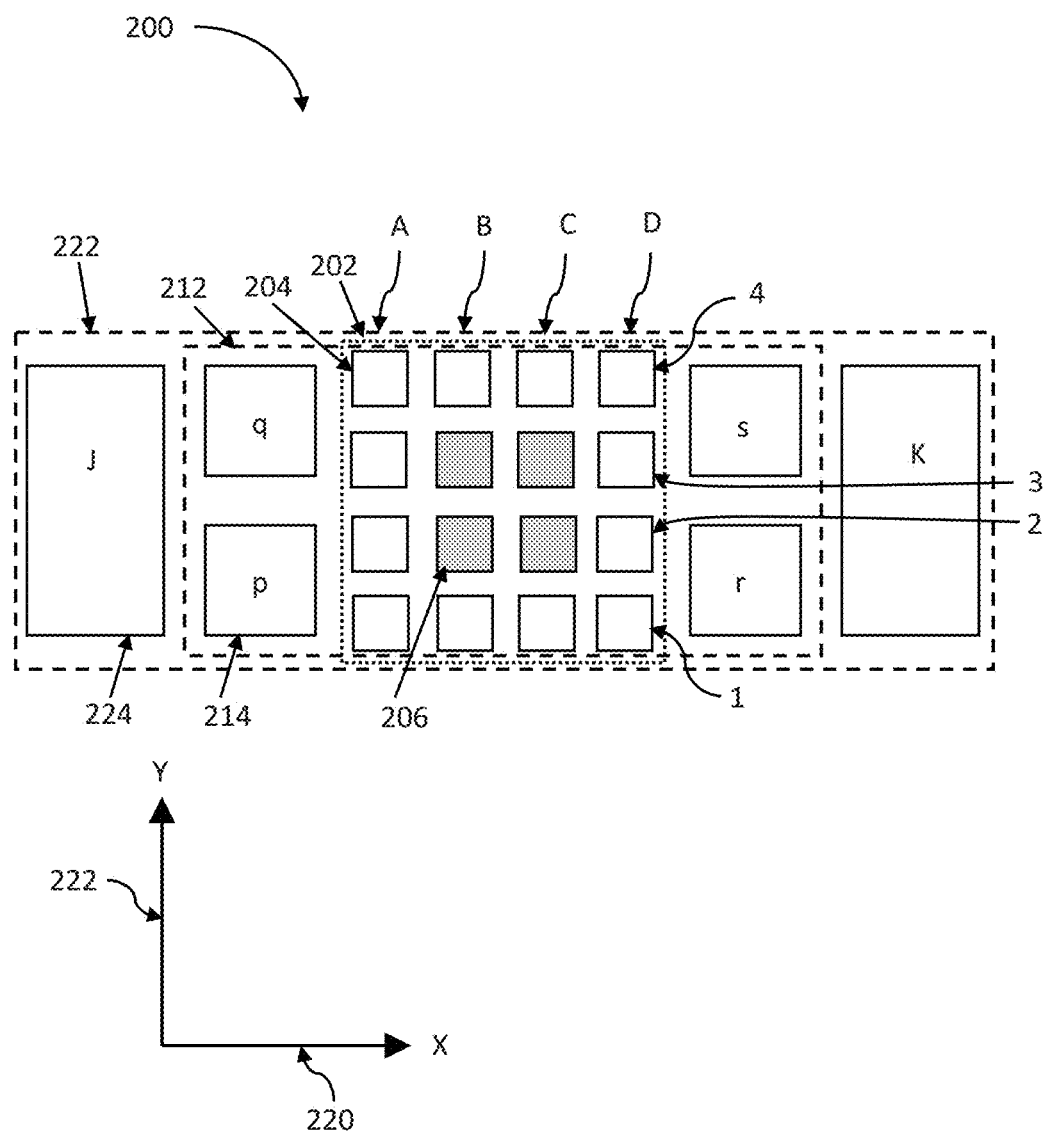
FIG. 10 is schematic top view of an example piezoelectric capacitor assembly showing piezoelectric capacitors (PUTs, PFEs, and haptic transmitters).

FIG. 10 is a schematic top view of an example piezoelectric capacitor assembly 200 which includes the following piezoelectric capacitors: PUT transmitters, PUT receivers, PFEs, and haptic transmitters. For ease of understanding, wiring connections between the piezoelectric capacitors and the signal processing circuitry have been omitted from FIG. 10. The PUTs (PUT transmitters 204 shown as white squares and PUT receivers 206 shown as grey squares) are arranged in a two-dimensional array 202, extending along the X-axis (220) and Y-axis (222). The PUTs are arranged in columns (A, B, C, and D) and rows (1, 2, 3, and 4). In the example shown, the two-dimensional PUT array 202 has a square outer perimeter, but in other examples the outer perimeter can have other shapes such as a rectangle. In the example shown, the total number of PUTs is 16, of which 12 are PUT transmitters 204 and 4 are PUT receivers 206. In this example, the number of PUT receivers is less than the number of PUT transmitters. In this example, the PUTs are shown as squares because the piezoelectric capacitors are square. The overlap area of the first (bottom) electrode 172 and the second (top) electrode 174 defines the area of the piezoelectric capacitor. In other examples, the overlap area can have other shapes, such as a rectangle or a circle. In the example shown, the PUTs are of the same lateral size (area), but in other examples PUTs of different sizes are also possible.

The signal processing circuitry is coupled to the piezoelectric capacitor assembly. For the PUT transmitters 204, the signal processing circuitry is configured to generate first transmitter voltage signals that are applied between the respective first electrode and the second electrode of the respective PUT, upon which the respective PUT transmits ultrasound signals of a first frequency in longitudinal mode(s) propagating along a normal direction approximately normal to the piezoelectric member. At least some of the ultrasound signals travel towards the sense region. A benefit to a two-dimensional array of PUT transmitters is that by optimization of the voltage signals to each of the PUT transmitters, the transmitted ultrasound signals can be made to interfere constructively to achieve a beam-forming effect if desired. Each of the PUT receivers 206 is configured to output first receiver voltage signals between the respective first electrode and the respective second electrode of the respective PUT in response to ultrasound signals of the first frequency $F_1$ arriving at the respective PUT along the normal direction. A benefit to a two-dimensional array of PUT receivers is that the array could achieve two-dimensional positional resolution of a touch event. For example, in the use case shown in FIG. 1, a finger 118 is touching the cover layer 120 at a sense region 126. In particular, the finger has ridges 119 and corresponding valleys in between the ridges. Therefore, some of the PUT receivers might receive echo ultrasound signals that have undergone greater attenuation at the ridges 119, and some others of the PUT receivers might receive echo ultrasound signals that have undergone lesser attenuation at the valleys in between the ridges 119.

The piezoelectric capacitor assembly 200 includes four PFEs (214, locations identified as p, q, r, and s) arranged in a two-dimensional array 212. The PFE array 212 has an opening, which is devoid of PFEs, in which the PUT array 202 is disposed. The PFE array 212 and the PUT array 202 overlap. In the example shown, there are PFEs to the left of (p and q) and to the right of (r and s) of the PUT array 202. Each PFE measures the strain (force) at a respective X and Y location. For example, the PFE 214 at location q measures the strain at the piezoelectric member between the electrodes of that PFE. Therefore, the PFE array 212 achieves a two-dimensional positional resolution of strain (force) measurement. The source of this strain (e.g., touch excitation by a finger at the cover layer) could be at location q, p, r, s, or another location on the cover layer, or a component mechanically coupled to the cover layer 120. An advantage to combining the touch-sensing (PUTs) and force-measuring (PFEs) functions into one piezoelectric capacitor assembly is that it becomes possible to distinguish between stationary objects that touch but do not apply measurable force (e.g., water droplet on sense region 126) and moving objects that touch and apply measurable force (e.g., finger).

Figure 11:
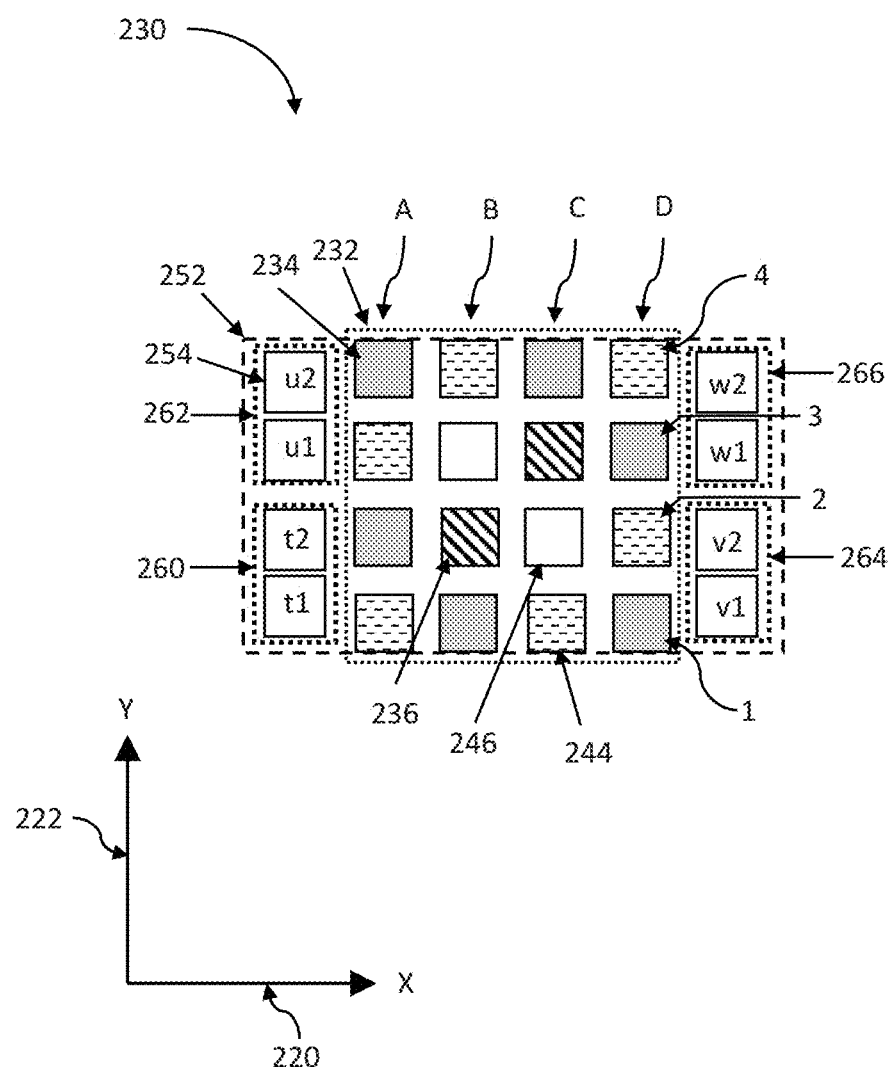
FIG. 11 is schematic top view of an example piezoelectric capacitor assembly showing piezoelectric capacitors (PUTs and PFEs).

Additionally, the piezoelectric capacitor assembly 200 includes two haptic transmitters (224, locations identified as J and K) arranged in a haptic transmitter array 222. More generally, a piezoelectric capacitor assembly may have one or more haptic transmitters. As illustrated in FIG. 11, a piezoelectric capacitor assembly may have no haptic transmitters. The signal processing circuitry is additionally configured to generate haptic voltage signals that are applied between the respective first electrode and the second electrode of the respective haptic transmitter, upon which the respective haptic transmitter vibrates at a haptic vibration frequency $F_H$ in a range of 100 Hz to 1 kHz. The haptic transmitter array 222 has an opening, which is devoid of haptic transmitters, in which the PUT array 202 and PFE array 212 are disposed. The haptic transmitter array 222 and the PFE array 212 overlap. The haptic transmitter array 222 and the PUT array 202 overlap. An advantage to implementing a haptic transmitter array is that a location of the haptic feedback (location J and/or K) can be selected.

FIG. 11 is a schematic top view of an example piezoelectric capacitor assembly 230 which includes the following piezoelectric capacitors: PUT transmitters, PUT receivers, and PFEs. For ease of understanding, wiring connections between the piezoelectric capacitors and the signal processing circuitry have been omitted from FIG. 11. The PUTs 234 are arranged in a two-dimensional array 232, extending along the X-axis (220) and Y-axis (222). The PUTs are arranged in columns (A, B, C, and D) and rows (1, 2, 3, and 4). The PUTs are configured to operate at frequencies $F_1$ and $F_2$. PUT array 232 contains first PUT transmitters (234, shown as grey squares) configured to transmit ultrasound signals at a first frequency $F_1$, first PUT receivers (236, shown as diagonal hatch-patterned squares) configured to receive ultrasound signals at the first frequency $F_1$, second PUT transmitters (244, shown as horizontal hatch-patterned squares) configured to transmit ultrasound signals at a second frequency $F_2$, and second PUT receivers (246, shown as white squares) configured to receive ultrasound signals at the second frequency $F_2$.

For the first PUT transmitters 234, the signal processing circuitry is configured to generate first transmitter voltage signals that are applied between the respective first electrode and the second electrode of the respective PUT, upon which the respective PUT transmits ultrasound signals of a first frequency $F_1$, in longitudinal mode(s) propagating along a normal direction approximately normal to the piezoelectric member. At least some of the ultrasound signals travel towards the sense region. Each of the first PUT receivers 236 is configured to output first receiver voltage signals between the respective first electrode and the respective second electrode of the respective PUT in response to ultrasound signals of the first frequency $F_1$ arriving at the respective PUT along the normal direction. The signal processing circuitry is configured to read at least some of the first receiver voltage signals. For the second PUT transmitters 244, the signal processing circuitry is configured to generate second transmitter voltage signals that are applied between the respective first electrode and the second electrode of the respective PUT, upon which the respective PUT transmits ultrasound signals of a second frequency $F_2$, in longitudinal mode(s) propagating along the normal direction. At least some of the ultrasound signals travel towards the sense region. Each of the second PUT receivers 246 is configured to output second receiver voltage signals between the respective first electrode and the respective second electrode of the respective PUT in response to ultrasound signals of the second frequency $F_2$ arriving at the respective PUT along the normal direction. The signal processing circuitry is configured to read at least some of the second receiver voltage signals.

In the example shown, the population of transducers is as follows: first PUT transmitters: 6, first PUT receivers: 2, second PUT transmitters: 6, and second PUT receivers: 2. The first PUT receivers number less than the first PUT transmitters and the second PUT receivers number less than the second PUT transmitters.

The piezoelectric capacitor assembly 230 additionally includes a PFE array containing eight PFEs (254). The PFEs are arranged into four sets (260, 262, 264, and 266), wherein each set is associated with a respective X and Y location. Therefore, the PFE array 252 achieves a two-dimensional positional resolution of strain (force) measurement. Each PFE set contains two PFEs. In the example shown, set 260 contains t1 and t2, set 262 contains u1 and u2, set 264 contains v1 and v2, and set 266 contains w1 and w2. In each set, two PFE are arranged side-by-side in the Y-direction. The PFEs in a set are electrically connected to each other. The electrical connections among the PFEs in a set are described in detail hereinbelow, with reference to FIGS. 15 and 16. The PFE array 252 and PUT array 232 overlap.

If the cover layer 120 is at room temperature (approximately 25° C.) and a human finger (approximately 37° C.) touches it at the sense region 126, temperatures in the sense region 126 and surrounding areas, including the piezoelectric capacitor assembly 102, might increase. There is likely to be temperature-induced drift in the ultrasound signal measured at the PUT receivers. In order to reduce the effect of this temperature-induced drift, it is preferable to operate the PUT transmitters and PUT receivers at two different frequencies $F_1$ and $F_2$, because the temperature-dependent drift characteristics will be different at different frequencies $F_1$ and $F_2$. Both frequencies $F_1$ and $F_2$ are preferably in a range of 0.1 MHz to 25 MHz. In order to minimize temperature-induced drift, the frequencies $F_1$ and $F_2$ are preferably sufficiently different from each other such that the temperature-dependent drift characteristics will be sufficiently different from each other. On the other hand, suppose that the first transmitters operate at a first central frequency $F_1$ with a bandwidth $\Delta F_1$, and the second transmitters operate at a second central frequency $F_2$ with a bandwidth $\Delta F_2$, with $F_1 < F_2$. If the frequencies and bandwidths are selected such that $F_1 + \Delta F_1/2$ is greater than $F_2 - \Delta F_2/2$ (the first and second bands overlap), then the power transmitted by the first and second transmitters will be additive. Accordingly, there are operational advantages to selecting the frequencies $F_1$ and $F_2$ to be sufficiently close to each other.

Figure 12:
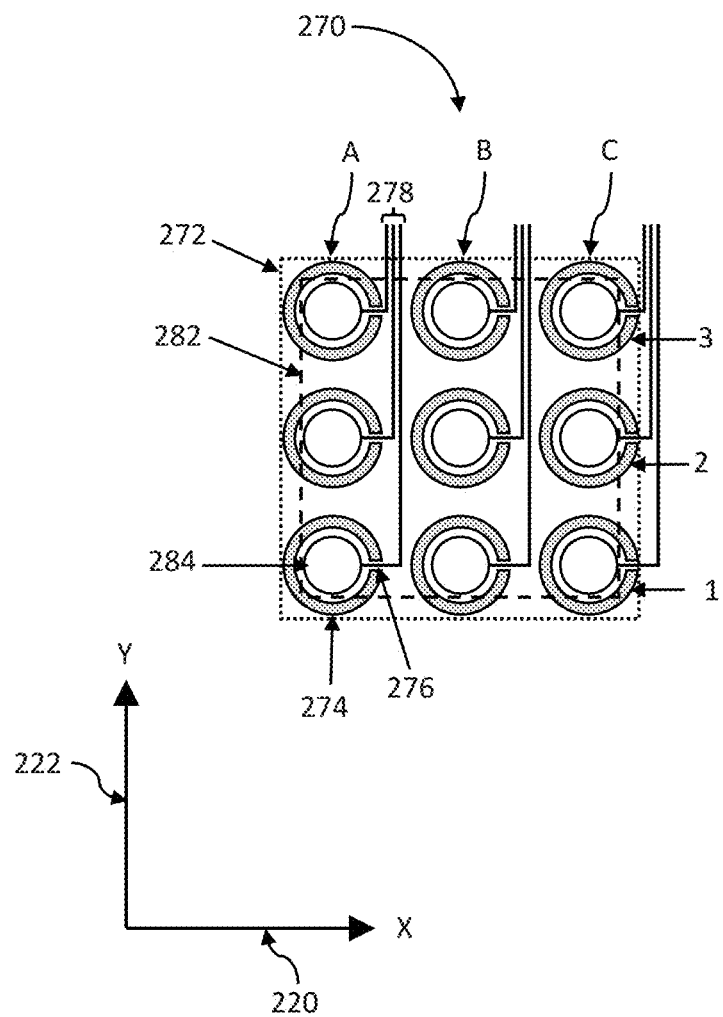
FIG. 12 is schematic top view of an example piezoelectric capacitor assembly in which PUTs and PFEs are concentric.

FIG. 12 is a top schematic view of example piezoelectric capacitors 270, as laid out in a piezoelectric capacitor assembly, including PUTs 274 and PFEs 284. The PUTs 274 are arranged in a two-dimensional array 272, extending along the X-axis (220) and Y-axis (222). The PUTs are arranged in columns (A, B, and C) and rows (1, 2, and 3). The PFEs 284 are arranged in a two-dimensional array 282, extending along the X-axis (220) and Y-axis (222). The PFEs are arranged in the same columns and rows as are the PUTs. The PUT array 272 and PFE array 282 overlap. At each array location (for example, A-1 or column A, row 1), there is a PUT-PFE pair in which the PUT is an outer piezoelectric capacitor, the PFE is an inner piezoelectric capacitor, PUT is a ring surrounding the PFE, and the PUT and PFE are concentric. For each PUT 274, there is an opening 276 (located around 3 o'clock), which provides a space that is traversed by a wiring connection 278. The wiring connection 278 couples the PUTs 274 to the signal processing circuitry. An advantage to such a concentric arrangement of PUTs and PFEs is that it may be possible to achieve excellent positional resolution to touch-sensing and force-measuring functionalities.

Depending on the configuration of the signal processing circuitry that is coupled to the PUTs 274, the PUTs may be configured to operate at one frequency $F_1$ or may be configured to operate at two frequencies $F_1$ and $F_2$. Additionally, depending on the configuration of the signal processing circuitry that is coupled to the PUTs 274, one or more of the PUTs may function as PUT transmitter(s), one or more of the PUTs may function as PUT receiver(s), and one or more of the PUTs may function as both PUT transmitter(s) and PUT receiver(s).

Figure 13:
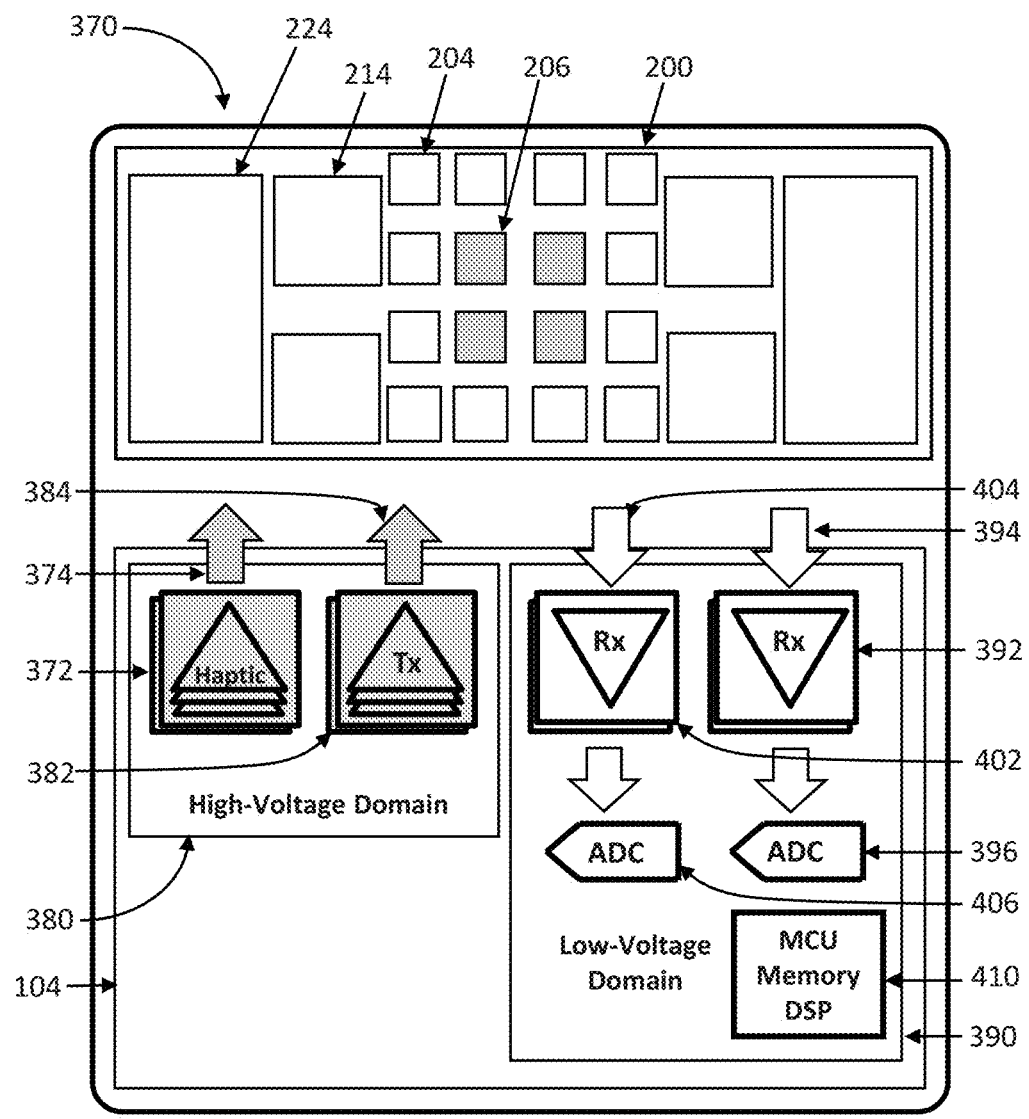
FIG. 13 is an electronics block diagram of an illustrative input system.

FIG. 13 is an electronics block diagram of a system 370 having force-measuring, touch-sensing, and haptic functionalities, including a piezoelectric capacitor assembly 200 (FIG. 10) and signal processing circuitry 104. The signal processing circuitry 104 can be implemented in ICs 114 (FIG. 1). The piezoelectric capacitor assembly 200 includes PUT transmitters 204, PUT receivers 206, PFEs 214, and haptic transmitters 224. Signal processing circuitry 104 includes a high-voltage domain 380 and a low-voltage domain 390. The high-voltage domain is capable of operating at higher voltages required for driving the PUT transmitters and haptic transmitters. The high-voltage domain includes high-voltage transceiver circuitry (372, 382), each including high-voltage drivers. The high-voltage transceiver circuitry 382 is connected to one or more of the electrodes of the PUT transmitters 204, via electrical interconnection 384. The high-voltage transceiver 382 is configured to output voltage pulses of 3.3 V or greater, depending on the requirements of the PUT transmitters. The high-voltage transceiver circuitry 372 is connected to one or more of the electrodes of the haptic transmitters 224, via electrical interconnection 374. The high-voltage transceiver 372 is configured to output voltage pulses of 3.3 V or greater, depending on the requirements of the haptic transmitters.

The low-voltage domain 390 includes amplifiers (392, 402) and analog-to-digital converters (ADCs) (396, 406). Voltage signals read from the PUT receivers 206 reach amplifiers 392 via electrical interconnections 394 and get amplified by the amplifiers 392. The amplified voltage signals are sent to ADC 396 to be converted to digital signals (PUT digital data) which can be processed or stored by other circuit blocks 410. Similarly, voltage signals read from PFEs 214 reach amplifiers 402 via electrical interconnections 404 and get amplified by the amplifiers 402. These amplified voltage signals are sent to ADC 406 to be converted to digital signals (PFE digital data) which can be processed or stored by other circuit blocks 410. The other circuit blocks 410 could be microcontrollers (MCUs), memories, and digital signal processors (DSPs), for example. The signal processing circuitry 104 includes these other circuit blocks 410.

The signal processing circuitry 104 reads voltage signals from at least some of the piezoelectric capacitors (e.g., at least some of the PFEs, and/or at least some of the PUT receivers). After additional signal processing, such as amplification and analog-to-digital conversion, PFE digital data and PUT digital data are obtained. For example, the signal processing circuitry can determine one of the following inputs from the PFE digital data and PUT digital data: (1) there has been no touch event because the PFE digital data indicates a measured force below a predetermined force threshold and the PUT digital data indicates an attenuation of the echo ultrasound signal below a predetermined ultrasound attenuation threshold; (2) there has been a touch by a digit (e.g., a finger) because the PFE digital data indicates a measured force greater than or equal to a predetermined force threshold and the PUT digital data indicates an attenuation of the echo ultrasound signal greater than or equal to a predetermined ultrasound attenuation threshold; and (3) there has been an event other than a touch by a digit (e.g., a liquid droplet) because the PFE digital data indicates a measured force below a predetermined force threshold and the PUT digital data indicates an attenuation of the echo ultrasound signal greater than or equal to a predetermined ultrasound attenuation threshold. The signal processing circuitry generates haptic voltage signals (haptic feedback) in accordance with voltage signals read from at least some of the piezoelectric capacitors. For example, in the case of input (2) (e.g., finger touch), the signal processing circuitry generates haptic voltage signals that actuate the haptic transmitter. For example, in the case of input (1) (no touch) or input (3) (e.g., liquid droplet), the signal processing circuitry generates haptic voltage signals (e.g., zero volts) that do not actuate the haptic transmitter.

Figure 14:
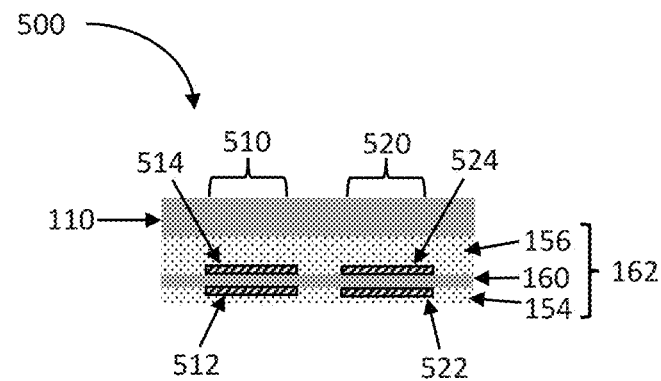
FIG. 14 is a schematic cross-sectional view of a set (pair) of PFEs.

FIG. 14 is a schematic cross-sectional view of a set 500 of PFEs 510 and 520. Also shown is the portion of the adhesive 110 that is above the PFEs 510 and 520. The adhesive 110 adheres the piezoelectric capacitor assembly 102 to the interior surface 122 (FIG. 1). FIG. 14 shows the PFE in a quiescent state analogous to the quiescent state described with reference to FIG. 6. A PFE was described with reference to FIG. 6. In the example shown, the piezoelectric stack 162 includes a piezoelectric member 160, a top mechanical layer 156, and a bottom mechanical layer 154. In a deformed state (shown in FIGS. 7, 8, and 9, for example), an electrical charge is generated between the PFE electrodes 512 and 514 of first PFE 510 and between the PFE electrodes 522 and 524 of the second PFE 520.

Figure 15:
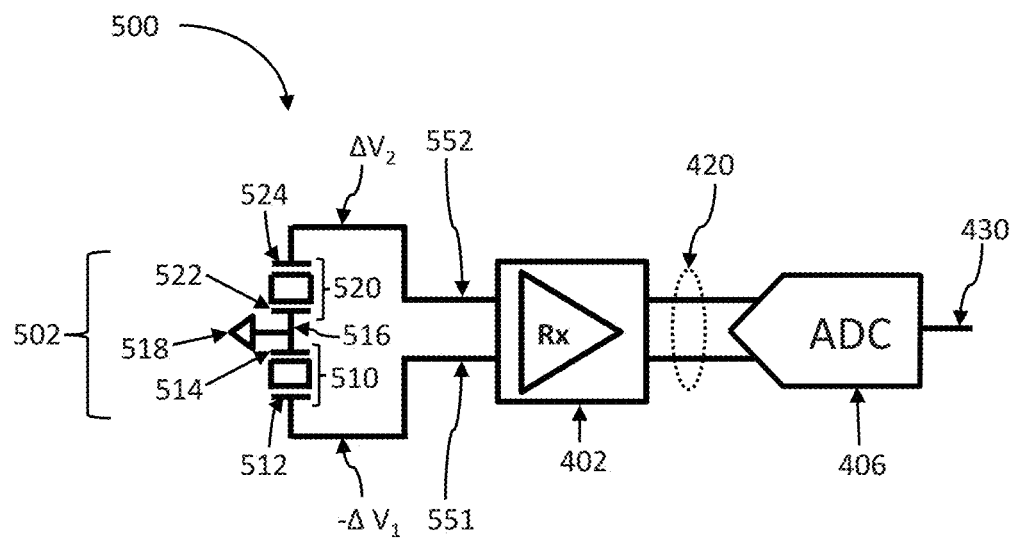
FIG. 15 is a block diagram illustrating the electrical connections of the PFE pair of FIG. 13 to related signal processing circuitry in an illustrative input system.

For each PFE (510, 520), the first PFE electrode (512, 522), the second PFE electrode (514, 524), and the piezoelectric member 160 between them constitute a piezoelectric capacitor. FIG. 15 is a block diagram illustrating the electrical connections of the PFE set (pair) to certain portions of the signal processing circuitry 104. In FIG. 15, we refer to each PFE (510, 520) as a piezoelectric capacitor. PFEs 510 and 520 are connected in series via a wire 516. Wire 516 connects second electrode (top electrode) 514 of first PFE 510 to the first electrode (bottom electrode) 522 of the second PFE 512. The outermost electrodes of the PFE electrodes in the series 502 are first electrode 512 of the first PFE 510 and the second electrode 524 of the second PFE 520. These outermost electrodes of the PFE electrodes in the series 502 are connected as differential inputs 551, 552 to the amplifier circuitry 402 of the signal processing circuitry 104. The voltage signals at inputs 551, 552 are amplified by the amplifier circuitry 402. Amplified voltage signals 420 are output from the amplifier circuitry 402 to the analog-to-digital converter (ADC) 406. Digital signals 430 are output from the ADC 406.

As shown in the example of FIG. 15, wire 516 is tied to a common node 518. In this case, we can refer to the node between the two adjacent PFEs 510, 520 connected in series as a common node. If the voltage of the common node is held at 0 V, the voltage signal input to input 551 can be expressed as $-\Delta V_1$, and the voltage signal input to input 552 can be expressed as $\Delta V_2$, where the subscripts refer to the first PFE (510) or second PFE (520). An advantage of a node between adjacent PFEs connected in series being a common node is that voltage offsets from the common node voltage are reduced, simplifying subsequent amplification of low-voltage signals.

Figure 16:
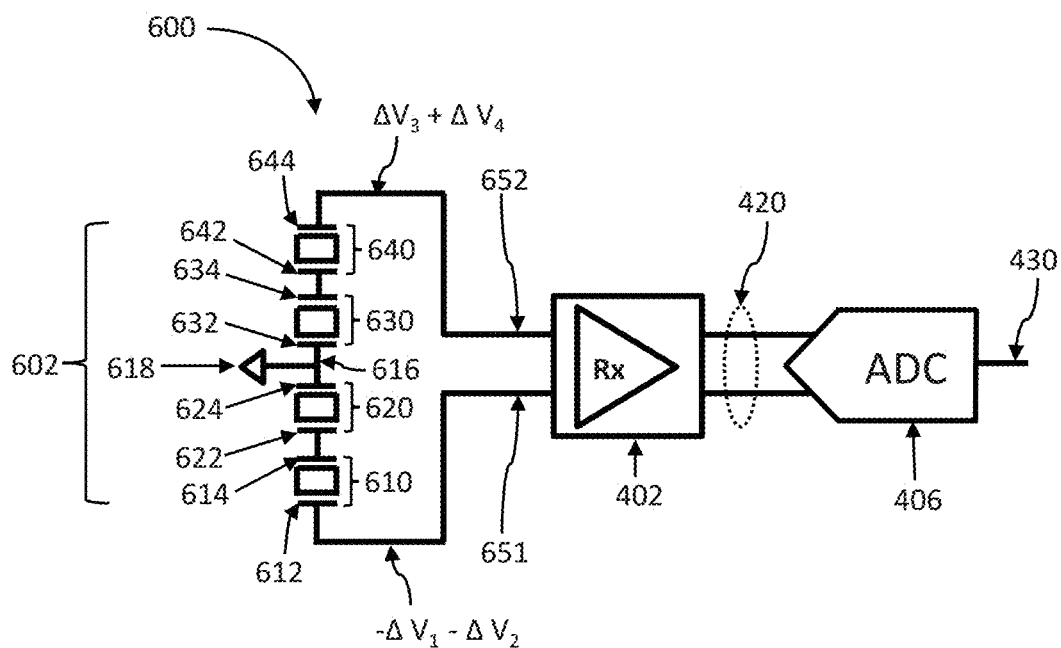
FIG. 16 is a block diagram illustrating the electrical connections of a set of PFEs to related signal processing circuitry in an illustrative input system.

FIG. 16 is a block diagram illustrating the electrical connections of a PFE set (600) to certain portions of the signal processing circuitry 104. FIG. 16 is similar to FIG. 15 except that there are four PFEs in the set and these four PFEs are connected in series. The second electrode 614 of the first PFE 610 is connected to the first electrode 622 of the second PFE 620, the second electrode 624 of the second PFE 620 is connected to the first electrode 632 of the third PFE 630, and the second electrode 634 of the third PFE 630 is connected to the first electrode 642 of the fourth PFE 640. The outermost electrodes of the PFE electrodes in the series 602 are first electrode 612 of the first PFE 610 and the second electrode 644 of the fourth PFE 640. These outermost electrodes of the PFE electrodes in the series 602 are connected as differential inputs 651, 652 to the amplifier circuitry 402 of the signal processing circuitry 104. The voltage signals at inputs 651, 652 are amplified by the amplifier circuitry 402. Amplified voltage signals 420 are output from the amplifier circuitry 402 to the analog-to-digital converter (ADC) 406. Digital signals 430 are output from the ADC 406.

Wire 616 connects the second electrode 624 of the second PFE 620 to the first electrode 632 of the third PFE 630. Wire 616 is tied to a common node 618. If the voltage of the common node is held at 0 V, the voltage signal input to input 651 can be expressed as $-\Delta V_1 - \Delta V_2$, and the voltage signal input to input 652 can be expressed as $\Delta V_3 + \Delta V_4$, where the subscripts refer to the first PFE (610), second PFE (620), third PFE (630), and fourth PFE (640).

Figure 17:
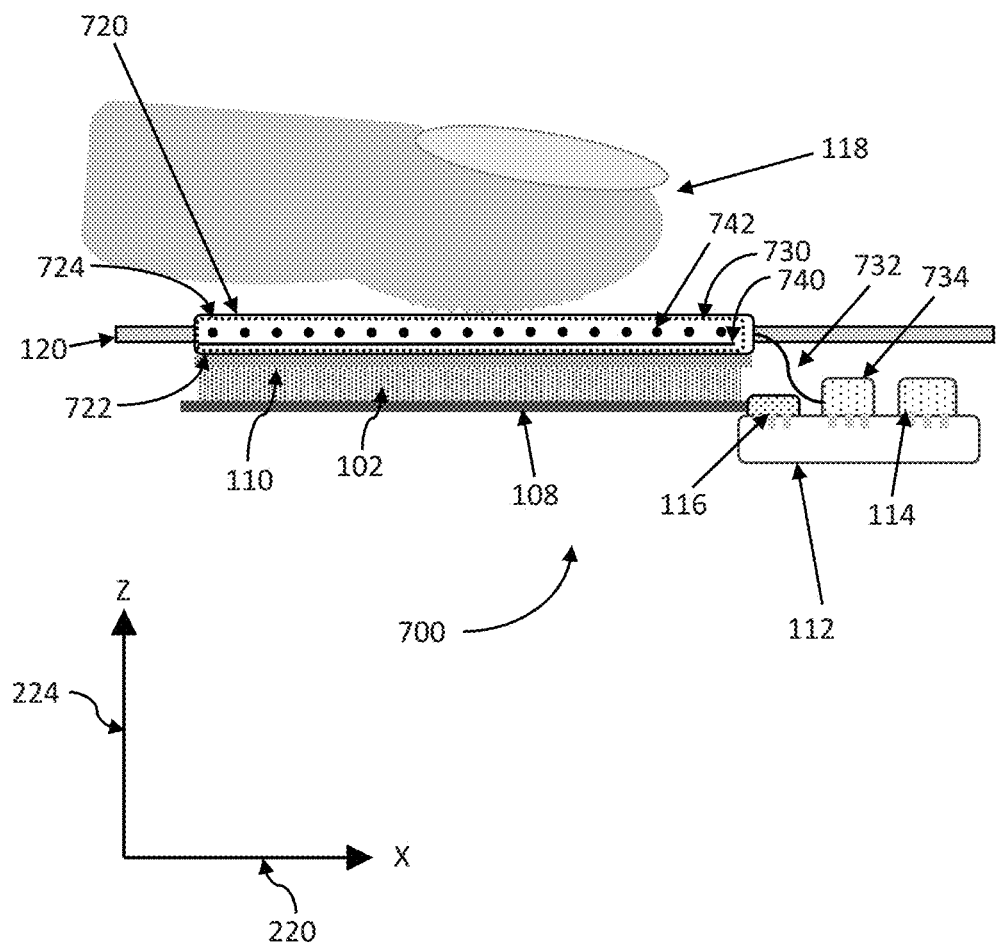
FIG. 17 is a schematic view of an illustrative input system which is a force-measuring and touch-sensing system.

FIG. 17 is a schematic view of an input system 700 which is a (force-measuring and touch-sensing system. The force-measuring and touch-sensing system 700 includes a piezoelectric capacitor assembly 102 and a capacitive touch panel assembly 720. In other examples, it is possible for a system to have more than one piezoelectric capacitor assembly 102. The piezoelectric capacitor assembly 102 is mounted to a flexible circuit substrate 108 (e.g., an FPC or flexible printed circuit). The piezoelectric capacitor assembly 102 includes piezoelectric force-measuring elements (PFEs). The flexible circuit substrate 108 is electrically and mechanically connected to a printed circuit board (PCB) 112 via a connector 116. Additionally, a touch panel controller 734 and other integrated circuits (other ICs) 114 are mounted on the PCB 112. Generally, signal processing circuitry can be implemented in the touch panel controller 634 and/or the other ICs 114. The signal processing circuitry can be implemented in a single IC, or in multiple ICs. Other ICs 114 can include a microcontroller (MCU), microprocessor (MPU), and/or a digital signal processor (DSP), for example. The ICs 114 could be used to run programs and algorithms to analyze and categorize events based on data received from the piezoelectric capacitor assembly 102.

In the example shown, the capacitive touch panel assembly 720 is embedded in a cover layer 120. The touch panel assembly 720 has an exposed outer surface 724 and an inner surface 722. The piezoelectric capacitor assembly 102 is adhered to the inner surface 722 of the touch panel assembly 720 by a layer of adhesive 110. The choice of adhesive 110 is not particularly limited as long as the piezoelectric capacitor assembly 102 remains attached to the cover layer. The adhesive 110, the cover layer 120, the piezoelectric capacitor assembly 102, the flexible circuit substrate 108, and other ICs 114, have been discussed with reference to FIG. 1.

The capacitive touch panel assembly 720 includes a grid region 730 containing wiring traces 740 extending in the X-direction (220) and wiring traces 742 extending in the Y-direction (into the page, perpendicular to the X-direction 220 and Z-direction 224). The capacitive touch panel assembly 720 is coupled to the touch panel controller IC 734 via a connector 732. For example, the touch panel controller 734 contains signal processing circuitry that measures the capacitance at each intersection of the X-direction wiring traces 740 and Y-direction wiring traces 742. For example, when a finger 118 touches a region of the capacitive touch panel assembly 720, the measured capacitance in the touched region changes Preferably, the capacitive touch panel assembly also includes a display, such as a deformable OLED (organic light-emitting diode) display or a deformable liquid crystal display (LCD). Preferably, the capacitive touch panel assembly 720 is sufficiently deformable such that when a force is imparted to the touch panel assembly on the outer surface 724, the piezoelectric capacitor assembly 102 that is adhered to the capacitive touch panel assembly 720 at its inner surface 722 also undergoes deformation (low-frequency mechanical deformation, see FIGS. 7, 8, and 9).

Figure 18:
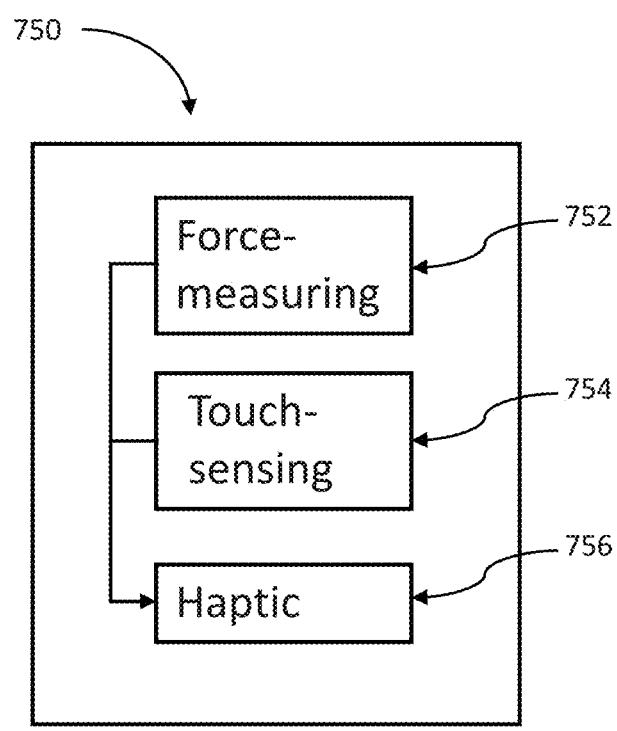
FIG. 18 is a block diagram of an input system having force-measuring, touch-sensing, and haptic feedback functionalities.

FIG. 18 is a block diagram of an input system 750 that includes a force-measuring subsystem 752 and a touch-sensing subsystem 754. Input system 750 also optionally includes a haptic actuator subsystem 756. The haptic actuator subsystem 756 is actuated in response to inputs received by the force-measuring subsystem 752 and/or inputs received by the touch-sensing subsystem 756. For example, the force-measuring subsystem 752 can be implemented using one or more of the following: piezoelectric capacitor force-measuring element and piezoresistive element. For example, the touch-sensing subsystem 754 can be implemented using one or more of the following: piezoelectric ultrasonic transducer, capacitive ultrasonic transducer, and capacitive touch panel. For example, the haptic actuator subsystem 756 can be implemented using one or more of the following: eccentric rotating mass actuator, linear resonant actuator, and piezoelectric actuator. FIGS. 1, 2, and 3 illustrate examples in which the force-measuring subsystem 752 is implemented using piezoelectric capacitor force-measuring elements, the touch-sensing subsystem 754 is implemented using piezoelectric ultrasonic transducers, and the haptic actuator subsystem 756 is implemented using a piezoelectric actuator, such that the piezoelectric capacitor force-measuring element, the piezoelectric ultrasonic transducers, and the piezoelectric actuator are integrated in a piezoelectric capacitor assembly 102. FIG. 17 illustrates examples in which the force-measuring subsystem 752 is implemented using a piezoelectric capacitor assembly 102 (piezoelectric capacitor force-measuring elements only) and the touch-sensing subsystem 754 is implemented using a capacitive touch panel 720.

What is claimed is:
1. A system, comprising:
   a piezoelectric capacitor assembly comprising:
      a piezoelectric member; and
      a plurality of piezoelectric capacitors located at respective lateral positions along the piezoelectric member, each of the piezoelectric capacitors comprising: (1) a respective portion of the piezoelectric member, (2) a first electrode, and (3) a second electrode, the first electrode and the second electrode being positioned on opposite sides of the piezoelectric member at the respective portion of the piezoelectric member; and
   a signal processing circuitry coupled to the piezoelectric capacitor assembly;
   wherein the piezoelectric capacitors comprise a plurality of piezoelectric force-measuring elements (PFEs), configured to output voltage signals between the respective first electrode and the respective second electrode (PFE voltage signals) in accordance with a time-varying strain at the respective portion of the piezoelectric member between the respective first electrode and the respective second electrode resulting from a low-frequency mechanical deformation; and
   the signal processing circuitry is configured to read at least some of the PFE voltage signals.
2. The system of claim 1, wherein the low-frequency mechanical deformation is induced by an excitation having a repetition rate of 100 Hz or less.
3. The system of claim 2, wherein the repetition rate is 10 Hz or less.

4. The system of claim 1, wherein the low-frequency mechanical deformation is induced by one or more of the following: touching, pressing, bending, twisting, typing, tapping, and pinching.

5. The system of claim 1, wherein the low-frequency mechanical deformation comprises a deformation of an entirety of the piezoelectric capacitor assembly.

6. The system of claim 1, wherein the low-frequency mechanical deformation comprises a compression and expansion of the piezoelectric member along a normal direction approximately normal to the piezoelectric member.

7. The system of claim 1, wherein the low-frequency mechanical deformation comprises elastic wave oscillations.

8. The system of claim 1, wherein the low-frequency mechanical deformation comprises expansion and/or compression of the piezoelectric member along a lateral direction approximately parallel to the piezoelectric member.

9. The system of claim 1, wherein the signal processing circuitry comprises amplifier circuitry for amplifying PFE voltage signals and analog-to-digital converter circuitry for converting amplified PFE voltage signals to PFE digital data.

10. The system of claim 1, wherein the piezoelectric capacitor assembly additionally comprises a mechanical layer coupled to the piezoelectric member.

11. The system of claim 10, wherein the mechanical layer comprises silicon, silicon oxide, silicon nitride, aluminum nitride, or a material that is included in the piezoelectric member.

12. The system of claim 1, wherein the piezoelectric member comprises aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, or $Bi_{0.5}Na_{0.5}TiO_3$ (BNT).

13. The system of claim 1, wherein the piezoelectric member is a piezoelectric film.

14. The system of claim 13, wherein the piezoelectric film comprises lead zirconate titanate (PZT).

15. The system of claim 1, wherein at least a portion of the signal processing circuitry is an integrated circuit.

16. The system of claim 1, additionally comprising a cover layer comprising an outer surface which can be touched by a digit and an inner surface opposite the outer surface, wherein the piezoelectric capacitor assembly is coupled to the inner surface, the piezoelectric capacitor assembly being oriented such that the piezoelectric member faces toward the cover layer.

17. The system of claim 16, wherein the piezoelectric capacitor assembly is oriented such that the piezoelectric member and the cover layer are approximately parallel.

18. The system of claim 16, wherein the cover layer comprises a material selected from the following: wood, glass, metal, plastic, leather, fabric, and ceramic.

19. The system of claim 1, wherein:
the piezoelectric capacitors comprise one or more piezoelectric ultrasonic transducers (PUTs), each of the PUTs being configured as a transmitter (PUT transmitter) and/or a receiver (PUT receiver), there being at least one PUT transmitter and at least one PUT receiver;
for at least one of the PUT transmitters (first PUT transmitter(s)), the signal processing circuitry is configured to generate first transmitter voltage signals that are applied between the respective first electrode and the respective second electrode of the respective first PUT transmitter, upon which the respective first PUT transmitter transmits ultrasound signals of a first frequency $F_1$, in longitudinal mode(s) propagating along a normal direction approximately normal to the piezoelectric member towards a sense region;
at least one of the PUT receivers (first PUT receiver(s)) is configured to output, in response to ultrasound signals of the first frequency $F_1$ arriving along the normal direction, first receiver voltage signals between the respective first electrode and the respective second electrode; and
the signal processing circuitry is configured to read at least some of the first receiver voltage signals.

20. The system of claim 19, wherein the respective portions of the piezoelectric member at the first PUT receivers oscillate at the first frequency $F_1$ in response to ultrasound signals of the first frequency $F_1$ arriving along the normal direction.

21. The system of claim 19, wherein the first frequency $F_1$ is in a range of 0.1 MHz to 25 MHz.

22. The system of claim 19, wherein the signal processing circuitry comprises a high-voltage transceiver circuitry configured to output voltage pulses of 3.3 V or greater, the high-voltage transceiver circuitry being configured to generate the first transmitter voltage signals.

23. The system of claim 19, wherein at least one of the PFEs and at least one of the PUTs are concentric.

24. The system of claim 19, additionally comprising a cover layer comprising an outer surface which can be touched by a digit and an inner surface opposite the outer surface, wherein the piezoelectric capacitor assembly is coupled to the inner surface, the piezoelectric capacitor assembly being oriented such that the piezoelectric member faces toward the cover layer, the sense region being at the outer surface.

25. The system of claim 19, wherein:
for at least one of the PUT transmitters (second PUT transmitter(s)), the signal processing circuitry is additionally configured to generate second transmitter voltage signals that are applied between the respective first electrode and the respective second electrode of the respective second PUT transmitter, upon which the respective second PUT transmitter transmits ultrasound signals of a second frequency $F_2$, in longitudinal mode(s) propagating along the normal direction towards the sense region;
at least one of the PUT receivers (second PUT receiver(s)) is configured to output, in response to ultrasound signals of the second frequency $F_2$ arriving along the normal direction, second receiver voltage signals between the respective first electrode and the respective second electrode; and
the signal processing circuitry is configured to read at least some of the second receiver voltage signals.

26. The system of claim 25, wherein the respective portions of the piezoelectric member at the second PUT receivers oscillate at the second frequency $F_2$ in response to ultrasound signals of the second frequency $F_2$ arriving along the normal direction.

27. The system of claim 25, wherein the second frequency $F_2$ is in a range of 0.1 MHz to 25 MHz.

28. The system of claim 25, wherein the signal processing circuitry comprises a high-voltage transceiver circuitry configured to output voltage pulses of 3.3 V or greater, the high-voltage transceiver circuitry being configured to generate the second transmitter voltage signals.

29. The system of claim 1, wherein the PFEs are arranged in an array (PFE array).

30. The system of claim 29, wherein the PFE array is two-dimensional.

31. The system of claim 30, wherein the piezoelectric capacitors comprise piezoelectric ultrasonic transducers (PUTs) arranged in a two-dimensional array (PUT array), and the PFE array and PUT array overlap.

32. The system of claim 1, wherein the PFEs are arranged into at least one set of PFEs (PFE set), and the at least one PFE set comprises a plurality of PFEs connected in series.

33. The system of claim 32, wherein outermost electrodes of the PFEs in the series are connected as differential inputs to an amplifier circuitry of the signal processing circuitry.

34. The system of claim 33, wherein a node between two adjacent PFEs in the series is a common node.

35. The system of claim 1, wherein the PFEs are arranged into sets of PFEs (PFE sets), each PFE set comprises two PFEs connected in series, and a node between the two PFEs is a common node.

36. The system of claim 1, wherein:
the piezoelectric capacitors comprise a haptic transmitter; and
the signal processing circuitry is configured to generate haptic voltage signals that are applied between the respective first electrode and the respective second electrode of the haptic transmitter, upon which the haptic transmitter vibrates at a haptic vibration frequency $F_H$, the haptic vibration frequency $F_H$ being in a range of 100 Hz to 1 kHz, the signal processing circuitry generating the haptic voltage signals in accordance with voltage signals read from at least some of the piezoelectric capacitors.

37. The system of claim 36, wherein the signal processing circuitry comprises a high-voltage transceiver circuitry configured to output voltage pulses of 3.3 V or greater, the high-voltage transceiver circuitry being configured to generate the haptic voltage signals.

38. The system of claim 1, additionally comprising a touch-sensing subsystem.

39. The system of claim 38, wherein the touch-sensing subsystem comprises one or more of the following: piezoelectric ultrasonic transducer, capacitive ultrasonic transducer, and capacitive touch panel.

40. The system of claim 38, additionally comprising a haptic actuator subsystem, wherein the haptic actuator subsystem is actuated in accordance with voltage signals read from at least some of the piezoelectric capacitors and/or inputs received by the touch-sensing subsystem.

41. The system of claim 40, wherein the haptic actuator subsystem comprises one or more of the following: eccentric rotating mass actuator, linear resonant actuator, and piezoelectric actuator.

* * * * *